(12) United States Patent
Xhafa et al.

(10) Patent No.: US 12,374,902 B2
(45) Date of Patent: Jul. 29, 2025

(54) WIRELESS BATTERY SYSTEM AND RELATED METHODS

(71) Applicant: Texas Instruments Incorporated, Dallas, TX (US)

(72) Inventors: Ariton E. Xhafa, Plano, TX (US); Ramanuja Vedantham, Frisco, TX (US); Minghua Fu, Plano, TX (US); Jesus Daniel Torres Bardales, Plano, TX (US); Mario Mlynek, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 715 days.

(21) Appl. No.: 17/397,636

(22) Filed: Aug. 9, 2021

(65) Prior Publication Data
US 2023/0042164 A1  Feb. 9, 2023

(51) Int. Cl.
| H02J 7/00 | (2006.01) |
| G01R 31/382 | (2019.01) |
| G01R 31/396 | (2019.01) |
| H02J 50/12 | (2016.01) |

(52) U.S. Cl.
CPC .......... *H02J 7/0014* (2013.01); *G01R 31/382* (2019.01); *G01R 31/396* (2019.01); *H02J 7/00036* (2020.01); *H02J 7/0048* (2020.01); *H02J 7/0071* (2020.01); *H02J 50/12* (2016.02)

(58) Field of Classification Search
CPC .... H02J 7/00036; H02J 7/0014; H02J 7/0047; H02J 7/0048; H02J 7/0071; G01R 31/371; G01R 31/396; G01R 31/382; G01R 31/367
See application file for complete search history.

(56) References Cited

U.S. PATENT DOCUMENTS

| 11,703,546 | B2 | 7/2023 | Urban et al. |
| 11,736,928 | B2 | 8/2023 | Xhafa et al. |
| 2020/0076013 | A1* | 3/2020 | Sato ............... H01M 10/48 |
| 2021/0320507 | A1* | 10/2021 | Hensley .......... H01M 10/441 |
| 2022/0183012 | A1* | 6/2022 | Shahid ............ H04W 72/53 |
| 2022/0360979 | A1 | 11/2022 | Krishnan et al. |

OTHER PUBLICATIONS

United States Patent and Trademark Office, "Non-Provisional Patent Application," filed Apr. 16, 2021, U.S. Appl. No. 17/233,106, 70 pages.

* cited by examiner

*Primary Examiner* — Julian D Huffman
*Assistant Examiner* — Sadia Kousar
(74) *Attorney, Agent, or Firm* — Carl G. Peterson; Frank D. Cimino

(57) ABSTRACT

Methods, apparatus, systems and articles of manufacture are described for a wireless battery system. An example apparatus includes at least one memory, instructions, and processor circuitry to at least one of instantiate or execute the instructions to identify a first battery node to transmit an uplink command during a first superframe interval, transmit a downlink command to the first battery node and a second battery node, the first battery node to switch in the first superframe interval from a receive state to a transmit state in response to the downlink command, the first battery node to transmit the uplink command in the transmit state, and receive the uplink command from the first battery node in the first superframe interval.

25 Claims, 17 Drawing Sheets

WIRELESS BATTERY SYSTEM AND RELATED METHODS

FIELD OF THE DISCLOSURE

This disclosure relates generally to vehicle battery systems and, more particularly, to a wireless battery system and related methods.

BACKGROUND

Hybrid electric vehicles (HEVs) and electric vehicles (EVs) are powered by battery systems include batteries such as lithium-ion batteries. The battery systems may include a battery management system to monitor the health of the batteries and report the health to a main electronic control unit (ECU) of the HEVs or EVs. The health of the batteries may be impacted by a wide range of conditions.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
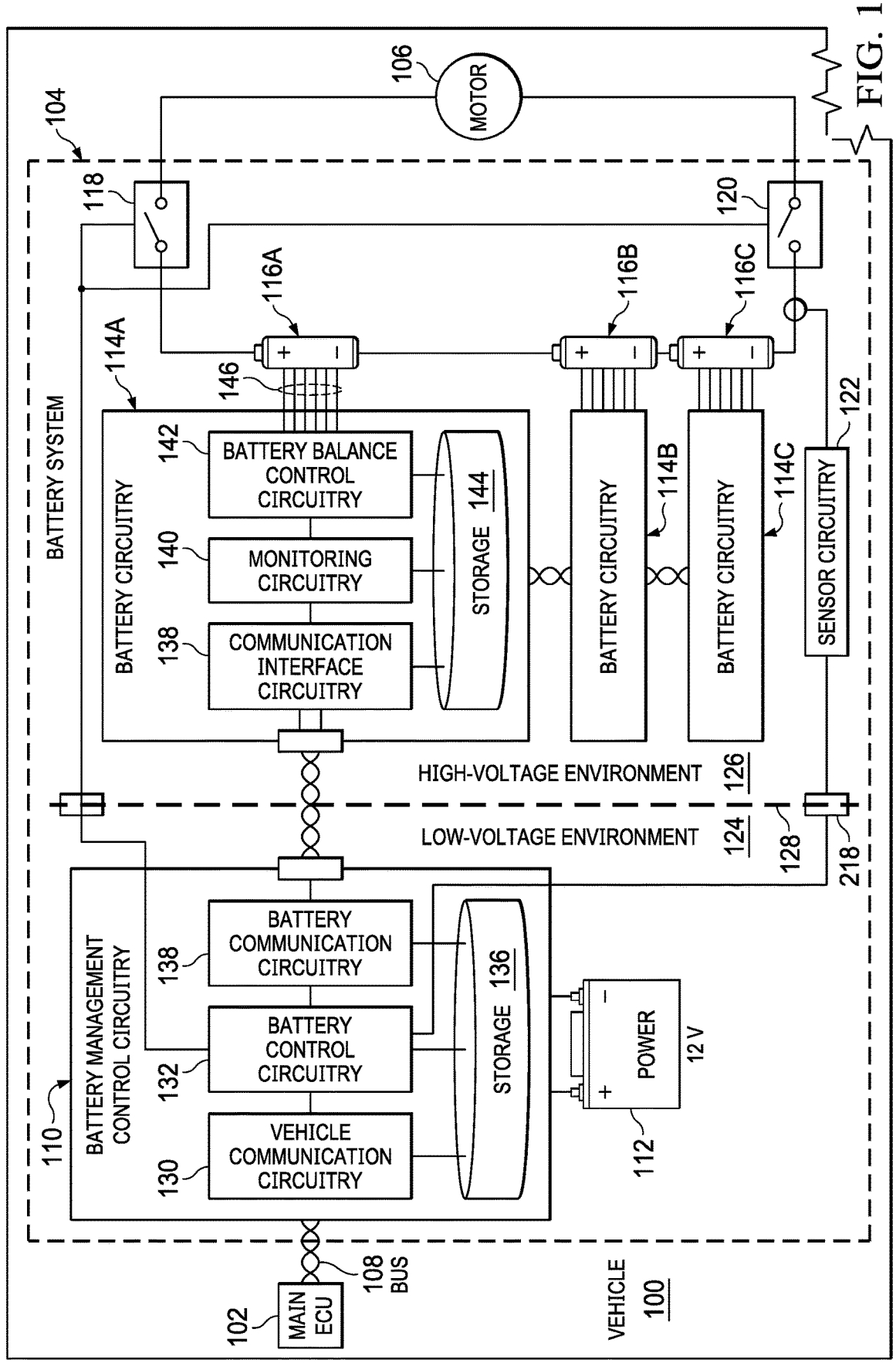
FIG. 1 is a schematic diagram of an example vehicle including an example battery system including example batteries, example battery management control circuitry, and example battery circuitry.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the described examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

Some battery management systems utilized in vehicles include a plurality of batteries, which may be implemented as battery cells, battery modules, or battery units. Vehicles including the plurality of the batteries may include an electric vehicle (EV) (e.g., a land vehicle or an automobile including an electric motor), a hybrid electric vehicle (HEV) (e.g., a land vehicle or an automobile including a combustion engine and an electric motor), etc. Each battery may be coupled to a battery monitor for reporting a health of the battery (e.g., a current measurement, a voltage measurement, a temperature reading, etc.) and/or of other batteries to a main electronic control unit (ECU) of the vehicles. In some instances, the battery monitor may be used to maintain the health of the batteries by facilitating a change in the battery performance by decreasing a temperature of one(s) of the batteries. As such, the battery monitor may report battery conditions and performance parameters to main battery management control circuitry. As a result, in response to detecting a change in performance or health in one(s) of the batteries, the main battery management control circuitry may generate a balancing command (e.g., a battery balancing command, a cell balancing command, etc.) or a maintenance command to one(s) of the batteries and/or associated health monitor(s) to re-balance charge levels of the batteries.

Some such battery management systems include coupling battery cells together utilizing wiring techniques such as isolated Serial Peripheral Interface (isoSPI) coupling circuitry or twisted pair cabling. Such wiring techniques may require the use of choke capacitors for isolation and protection between high and low voltage areas in the battery management systems. Such wiring techniques increase costs (e.g., bill of materials cost, battery system repair costs, etc.), vehicle weight, and complexities in repair and replacement.

Examples described herein include an example wireless battery system to simplify and improve a vehicle battery management system. In some described examples, wireless battery management control circuitry is communicatively coupled by wireless connection(s) to battery nodes, which may be implemented by battery circuitry including a battery. In some such described examples, the wireless battery management control circuitry may reduce power consumption of the wireless battery system by instructing respective ones of the battery nodes to transmit data frames (e.g., keep alive data frames, uplink commands, uplink data frames, etc.) every N superframes. For example, the wireless battery management control circuitry may implement a node skipping technique (e.g., a node transmit (TX) skipping technique) by instructing a battery node to transmit a data frame every N superframes and skip transmission of the data frame otherwise. As used herein, the term "superframe" is a data frame based on a Transmission System 1 (T1) framing standard (also referred to as D4 framing).

In some described examples, the wireless battery management control circuitry may improve fault detection of the wireless battery system by reconstructing the superframe based on uplink allocations of a superframe and a downlink allocation of a subsequent superframe. For example, the wireless battery management control circuitry may implement a superframe reconstruction technique by redefining and/or otherwise implementing the superframe based on the uplink allocations of the superframe and the downlink allocation of the subsequent superframe.

In some described examples, the wireless battery management control circuitry may improve network formation of the wireless battery system by interleaving superframe intervals between fast sequence wakeup data frames. For example, the wireless battery management control circuitry may implement an alternating interval type technique based on the interleavings.

Advantageously, the example wireless battery systems described herein reduce battery system cost, and/or, more generally, vehicle cost, battery repair and replacement complexity, and vehicle weight (which may increase a fuel efficiency of the vehicle). Advantageously, the example wireless battery systems described herein improve battery life cycle longevity by reducing power consumption during system operation.

FIG. 1 is a schematic diagram of an example vehicle 100 including an example electronic control unit (ECU) 102, an example battery system 104, and an example motor 106. In this example, the vehicle 100 is an electric vehicle (EV). Alternatively, the vehicle 100 may be a hybrid electric vehicle (HEV). In this example, the ECU 102 is a main ECU that is implemented by processor circuitry in one or more integrated circuit (IC) packages. For example, the ECU 102 may be a main ECU communicatively coupled to one or more other ECUs, vehicle sensors, vehicle actuators, etc., and/or a combination thereof, by an example bus 108. In this example, the bus 108 is implemented using a wired connection (e.g., a twisted pair connection). In this example, the bus 108 may be implemented by a communication and/or electrical bus based on an automotive or industrial protocol such as controller area network (CAN) protocol, J1939 protocol, Serial Peripheral Interface (SPI) protocol, etc. Alternatively, the bus 108 may be implemented by any other type of communication and/or electrical bus. In this example, the motor 106 is an electric motor. Alternatively, the motor 106 may be any other type of motor.

The battery system 104 includes example battery management control circuitry 110, an example low voltage power source 112, instances of example battery circuitry 114A-C, example batteries 116A-C, first example relay circuitry 118, second example relay circuitry 120, and example sensor circuitry 122. In this example, the batteries 116A-C are lithium-ion batteries. For example, one(s) of the batteries 116A-C may each be a lithium-ion battery including a plurality of cells (e.g., 12 cells, 24 cells, etc.). Alternatively, the batteries 116A-C may be any other type of battery (e.g., a rechargeable battery) such as a nickel-metal hydride battery and/or energy storage device (e.g., an ultracapacitor).

The battery system 104 includes an example low-voltage environment 124 and an example high-voltage environment 126 that meet at an example voltage boundary 128. In this example, the low-voltage environment 124 is configured to operate at 12 V direct current (DC) because the low voltage power source 112 is a 12 V DC battery. Alternatively, the low-voltage environment 124 may be configured to operate at any other voltage. In some examples, the high-voltage environment 126 may be configured to operate at hundreds of volts DC (e.g., 100 V DC, 200 V DC, 400 V DC, 800 V DC, etc.).

The battery management control circuitry 110 includes example vehicle communication circuitry 130, example battery control circuitry 132, example battery communication circuitry 134, and first example storage 136. In this example, input(s) and/or output(s) of the vehicle communication circuitry 130 is/are coupled to respective output(s) and/or input(s) the ECU 102 by the bus 108. Input(s) and/or output(s) of the vehicle communication circuitry 130 is/are coupled to respective output(s) and/or input(s) of the battery control circuitry 132. Input(s) and/or output(s) of the battery control circuitry 132 is/are coupled to respective output(s) and/or input(s) of the battery communication circuitry 134. Input(s) and/or output(s) of the battery communication circuitry 134 is/are coupled to respective output(s) and/or input(s) of the battery circuitry 114A-C by the bus 108. In this example, the vehicle communication circuitry 130, the battery control circuitry 132, and the battery communication circuitry 134 are coupled to the first storage 136.

The battery management control circuitry 110 includes the vehicle communication circuitry 130 to interface with the ECU 102 and/or, more generally, the vehicle 100 (e.g., one or more other ECUs than the ECU 102, a vehicle actuator, a vehicle infotainment system, etc.). For example, the vehicle communication circuitry 130 may deliver and/or otherwise transmit data, measurements, etc., associated with the battery circuitry 114A-C, the batteries 116A-C, and/or the sensor circuitry 122 to the ECU 102. In some examples, the vehicle communication circuitry 130 may receive commands, instructions, etc., from the ECU 102 to control operation of at least one of the battery circuitry 114A-C, the first relay circuitry 118, the second relay circuitry 120, and/or the motor 106.

The battery management control circuitry 110 includes the battery control circuitry 132 to monitor and/or control operation of the battery circuitry 114A-C. For example, the battery control circuitry 132 may instruct the battery communication circuitry 134 to transmit a command, an instruction, etc., to the battery circuitry 114A-C by the bus 108. In some such examples, the command, the instruction, etc., may include a request for measurements associated with the batteries 116A-C, which may include a current, a voltage, and/or a temperature of the batteries 116A-C. In some examples, the command, the instructions, etc., may include a balance command to re-balance charge levels of the batteries 116A-C.

In some examples, the battery control circuitry 132 controls the first relay circuitry 118 and/or the second relay circuitry 120. For example, the battery control circuitry 132 may turn on and/or otherwise enable the first relay circuitry 118 and/or the second relay circuitry 120 to deliver power from the batteries 116A-C to the motor 106. In some examples, the battery control circuitry 132 may turn off and/or otherwise disable the first relay circuitry 118 and/or the second relay circuitry 120 to remove power from the motor 106. In this example, the first relay circuitry 118 and/or the second relay circuitry 120 may be implemented by one or more relays, switches, etc., and/or a combination thereof.

In some examples, the battery control circuitry 132 obtains sensor measurements associated with the batteries 116A-C from the sensor circuitry 122. For example, the sensor circuitry 122 may measure a current and/or a voltage associated with the batteries 116A-C, the motor 106, first relay circuitry 118, and/or the second relay circuitry 120. In this examples, the sensor circuitry 122 may be implemented with one or more sensors such as current sensors, voltage sensors, etc., and/or a combination thereof.

The battery management control circuitry 110 includes the battery communication circuitry 134 to transmit and/or receive data. In some examples, the battery communication circuitry 134 may transmit data, which may include requests for measurements and/or commands (e.g., balance or re-balance commands), to the battery circuitry 114A-C by the bus 108. In some examples, the battery communication circuitry 134 may receive data, which may include the measurements associated with the batteries 116A-C, from the battery circuitry 114A-C by the bus 108. In some examples, the battery communication circuitry 134 may store the received data in the first storage 136.

The battery management control circuitry 110 includes the first storage 136 to store data. For example, the first storage 136 may store data received by the vehicle communication circuitry 130 and/or the battery communication circuitry 134. In some examples, the first storage 136 may receive data obtained by the battery control circuitry 132 from the sensor circuitry 122.

The battery circuitry 114A-C of the illustrated example includes first example battery circuitry 114A, second example battery circuitry 114B, and third example battery circuitry 114C. Alternatively, there may be fewer or more instances of the battery circuitry 114A-C than depicted in FIG. 1. One or more of the battery circuitry 114A-C may each include example communication interface circuitry 138, example monitoring circuitry 140, example battery balance control circuitry 142, and second example storage 144.

In this example, output(s) and/or input(s) of the communication interface circuitry 138 is/are coupled to respective input(s) and/or output(s) of the battery communication circuitry 134 by the bus 108. Output(s) and/or input(s) of the communication interface circuitry 138 is/are coupled to respective input(s) and/or output(s) of the monitoring circuitry 140. Output(s) and/or input(s) of the monitoring circuitry 140 is/are coupled to respective input(s) and/or output(s) of the battery balance control circuitry 142. Output(s) and/or input(s) of the battery balance control circuitry 142 is/are coupled to respective input(s) and/or output(s) of the batteries 116A-C by example battery balance circuitry 146. In some examples, the battery circuitry 114A-C includes the battery balance circuitry 146. In this example, the communication interface circuitry 138, the monitoring circuitry 140, and the battery balance control circuitry 142 are coupled to the second storage 144.

The battery circuitry 114A-C includes the communication interface circuitry 138 to receive and/or transmit data. In some examples, the communication interface circuitry 138 may receive data, such as a request for data or a command, from the battery communication circuitry 134 by the bus 108. In some examples, the communication interface circuitry 138 may transmit data, such as measurement data associated with the batteries 116A or an acknowledgment of a receipt or completion of the command, to the battery communication circuitry 134 by the bus 108.

The battery circuitry 114A-C includes the monitoring circuitry 140 to monitor and/or otherwise control operation of the batteries 116A-C. In some examples, the monitoring circuitry 140 measures a condition, a parameter, etc., associated with the batteries 116A-C, which may include a current, a voltage, a temperature, etc. In some such examples, the monitoring circuitry 140 may measure the condition, the parameter, etc., by obtaining the measurement from the battery balance control circuitry 142. In some examples, the monitoring circuitry 140 determines a state of charge and/or a depth of charge of one(s) of the batteries 116A-C based on an amperage measurement, a voltage measurement, etc., measured by the monitoring circuitry 140, the battery balance control circuitry 142, and/or the battery balance circuitry 146. As used herein, the term "state of charge" may refer to a level of charge of a battery relative to its capacity. In some examples, a state of charge may have a unit of measure of percentage points (e.g., 0%=empty, 100%=full, etc.). As used herein, the term "depth of charge" may refer to an inverse of a level of charge of a battery relative to its capacity. In some examples, a depth of charge may have a unit of measure of percentage points (e.g., 100%=empty, 0%=full, etc.).

The battery circuitry 114A-C includes the battery balance control circuitry 142 to monitor and/or control balancing operations (e.g., battery balance operations) associated with the batteries 116A-C. In some examples, the battery balance control circuitry 142 obtains measurements associated with the batteries 116A-C, which may include a current (e.g., an amperage measurement), a voltage (e.g., a voltage measurement), a temperature (e.g., a temperature measurement), etc., associated with one(s) of the batteries 116A-C. In some such examples, the battery balance circuitry 146 may include one or more current, voltage, and/or temperature sensors or associated sensor circuitry.

In some examples, the battery balance control circuitry 142 may control the battery balance circuitry 146 to execute a balance operation by rebalancing charge levels of one(s) of the batteries 116A-C. For example, the battery balance circuitry 146 may be implemented by passive battery balancing circuitry, which may drain charge from one(s) of the batteries 116A-C that have excess charge relative to the other one(s) of the batteries 116A-C. In some such examples, the passive battery balancing circuitry may be implemented with a resistor coupled in parallel with each of the batteries 116A-C, which may implement a fixed shunt resistor circuit that can be used to drain charge from the respective one(s) of the batteries 116A-C. The battery balance circuitry 146 may include a switch (e.g., a transistor) coupled between each resistor and battery pair. The battery balance control circuitry 142 may control the switch by turning on or off the switch to effectuate a battery balancing operation on one(s) of the batteries 116A-C. Alternatively, the passive battery balancing circuitry may be implemented with a Zener diode and a resistor coupled in parallel with each of the batteries 116A-C, which may be used to drain charge from the respective one(s) of the batteries 116A-C and turn off battery balancing when a battery voltage drops below a threshold.

In some examples, the battery balance circuitry 146 may be implemented by active battery balancing circuitry, which may drain charge from one(s) of the batteries 116A-C that have excess charge relative to the other one(s) of the batteries 116A-C. In some such examples, the active battery balancing circuitry may be implemented with a switch (e.g., a transistor, a single-pole-double-throw switch, etc.) and a capacitor coupled in parallel with each of the batteries 116A-C, that can be used to provide charge from first one(s) of the batteries 116A-C that have a higher charge with respect to an average, median, etc., level of charge of the batteries 116A-C to second one(s) of the batteries 116A-C that have a lower charge with respect to the average, the median, etc. In some such examples, the battery balance control circuitry 142 may control the switch by turning on or off the switch to execute a battery balancing operation on one(s) of the batteries 116A-C. Alternatively, the active battery balancing circuitry may be implemented with a switch in parallel with each of the batteries 116A-C and a switched transformer, which may be used to transfer charge from first ones(s) of the batteries 116A-C that have a higher level of charge to second one(s) of the batteries 116A-C that have a lower level of charge.

The battery circuitry 114A-C includes the second storage 144 to store data. For example, the second storage 144 may store data received by the communication interface circuitry 138 and/or the monitoring circuitry 140. In some examples, the second storage 144 may receive data obtained and/or otherwise measured by the battery balance control circuitry 142 by the battery balance circuitry 146.

In some examples, one or more of the vehicle communication circuitry 130, the battery control circuitry 132, the battery communication circuitry 134, the first storage 136, and/or, more generally, the battery management control circuitry 110, the communication interface circuitry 138, the monitoring circuitry 140, the battery balance control circuitry 142, second storage 144, the battery balance circuitry 146, and/or, more generally, the battery circuitry 114A-C, and/or the battery balance circuitry 146 may be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) (e.g., field programmable gate array(s) (FPGA(s))). In some examples, the first storage 136 and/or the second storage 144 may be implemented with non-volatile memory (e.g., electrically erasable programmable read-only memory (EEPROM), flash memory, etc.) and/or volatile memory (e.g., Synchronous Dynamic Random Access Memory (SDRAM), Dynamic Random Access Memory (DRAM), RAMBUS® Dynamic Random Access Memory (RDRAM®), and/or any other type of random access memory device).

Figure 2A:
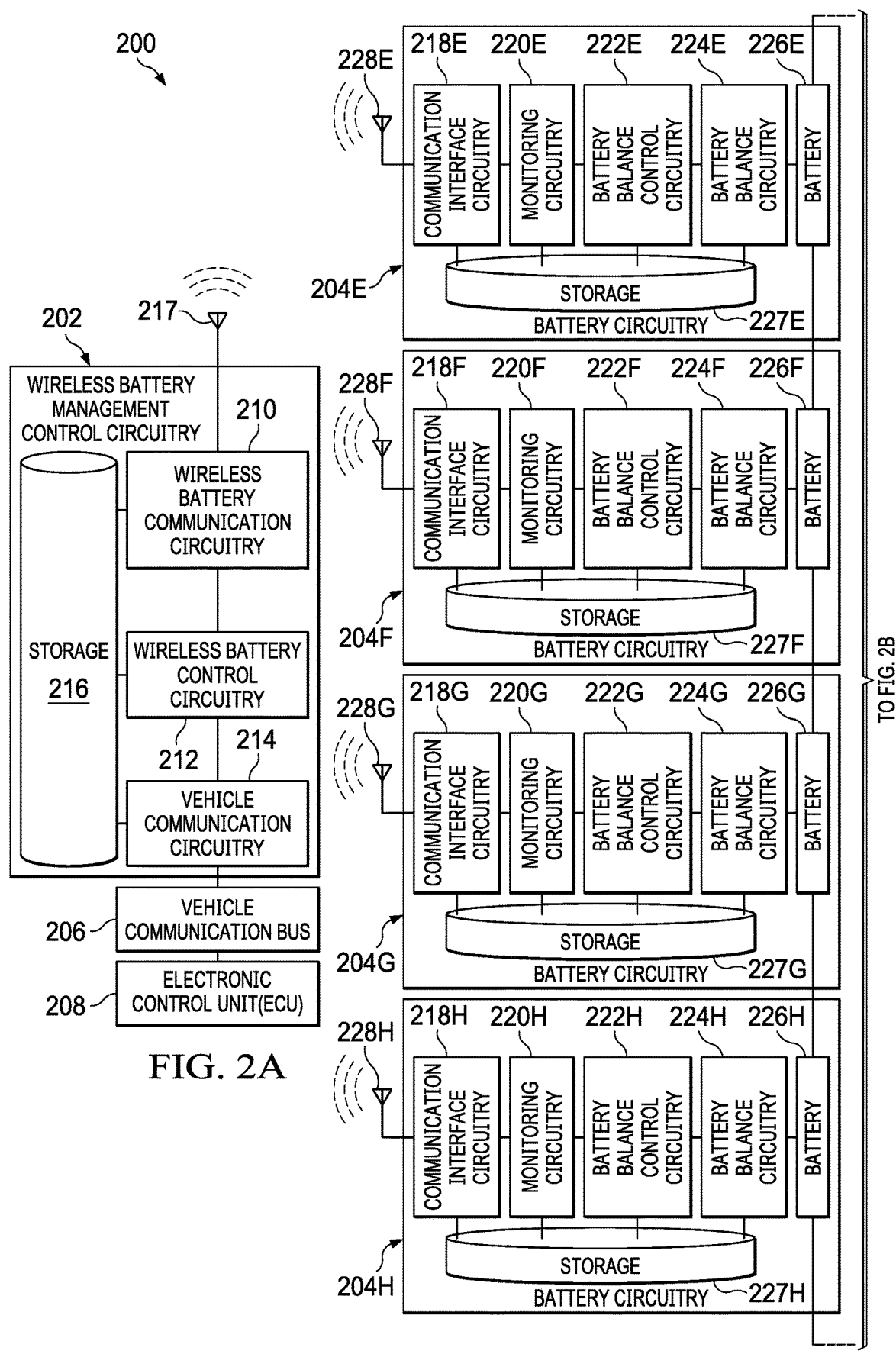
FIGS. 2A and 2B are schematic diagrams of an example wireless battery system including example batteries, example wireless battery management control circuitry, and example battery circuitry.
Figure 2B:
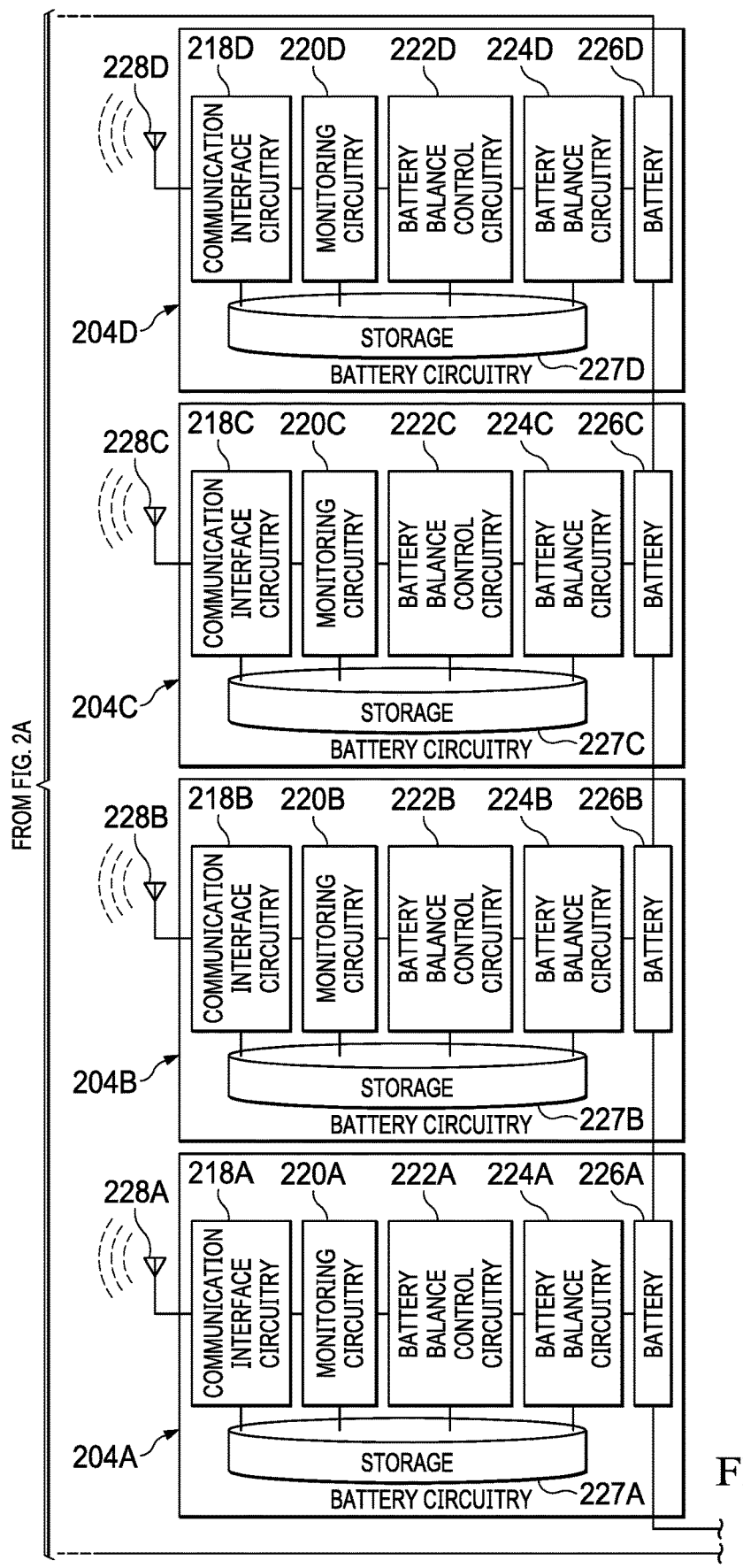

FIGS. 2A-2B is a schematic diagram of an example wireless battery system 200 including example wireless battery management control circuitry 202, example battery circuitry 204A-H, an example vehicle communication bus 206, and an example electronic control unit (ECU) 208. In some examples, the vehicle communication bus 206 may implement the bus 108 of FIG. 1. In some examples, the ECU 208 of FIGS. 2A-2B may implement the ECU 102 of FIG. 1.

The wireless battery system 200 includes the wireless battery management control circuitry 202 to achieve monitoring and/or control of the battery circuitry 204A-H and/or, more generally, communication with the battery circuitry 204A-H, via wireless connection(s). The wireless battery management control circuitry 202 of the illustrated example includes example wireless battery communication circuitry 210, example wireless battery control circuitry 212, example vehicle communication circuitry 214, and third example storage 216.

The wireless battery communication circuitry 210 is coupled to an example transceiver 217. For example, the transceiver 217 may receive and/or transmit data using wireless communication techniques. In some such examples, the transceiver 217 may be implemented by an electromagnetic antenna (e.g., a radiofrequency antenna), a printed circuit board (PCB) antenna, etc. For example, the transceiver 217 may be implemented by an antenna that is configured to at least one of receive or transmit radiofrequency signals. In some examples, the transceiver 217 may implement wireless communication such as wireless fidelity (Wi-Fi) communication, Wi-Fi Direct communication, Bluetooth communication, near field communication (NFC), etc., and/or a combination thereof. Alternatively, the wireless battery management control circuitry 202 may include the transceiver 217.

In this example, input(s) and/or output(s) of the vehicle communication circuitry 214 is/are coupled to respective output(s) and/or input(s) the ECU 208 by the vehicle communication bus 206. Input(s) and/or output(s) of the vehicle communication circuitry 214 is/are coupled to respective output(s) and/or input(s) of the wireless battery control circuitry 212. Input(s) and/or output(s) of the wireless battery control circuitry 212 is/are coupled to respective output(s) and/or input(s) of the wireless battery communication circuitry 210. Input(s) and/or output(s) of the wireless battery communication circuitry 210 is/are coupled to the transceiver 217. In this example, the vehicle communication circuitry 214, the wireless battery control circuitry 212, and the wireless battery communication circuitry 210 are coupled to the third storage 216.

Each of the battery circuitry 204A-204H include an instance of example communication interface circuitry 218A-H, example monitoring circuitry 220A-H, example battery balance control circuitry 222A-H, example battery balance circuitry 224A-H, one of the batteries 226A-H, and an instance of fourth example storage 227A-H. Alternatively, one or more of the battery circuitry 204A-H may include more than one of the batteries 226A-H. In this example, the batteries 226A-H are lithium-ion batteries. For example, one(s) of the batteries 226A-H may each be a lithium-ion battery including a plurality of cells (e.g., 12 cells, 24 cells, etc.). Alternatively, the batteries 226A-H may be any other type of battery (e.g., a rechargeable battery) such as a nickel-metal hydride battery and/or energy storage device (e.g., an ultracapacitor). In this example, the battery circuitry 204A-H are coupled to each other in a series configuration. For example, a first one of the batteries 226A may be coupled to a second one of the batteries 226B in series. Alternatively, the battery circuitry 204A-H may be coupled to each other in any other configuration.

Each of the battery circuitry 204A-H is coupled to an example transceiver 228A-H. For example, the transceiver 228A-H may receive and/or transmit data using wireless communication techniques. In some such examples, the transceiver 228A-H may be implemented by an electromagnetic antenna (e.g., a radiofrequency antenna), a PCB antenna, etc. In some examples, the transceiver 228A-H may facilitate wireless communication such as Wi-Fi communication, Wi-Fi Direct communication, Bluetooth communication, NFC, etc., and/or a combination thereof. Alternatively, one or more of the battery circuitry 20A-H may include a respective one of the transceivers 228A-H.

In some examples, one or more of the wireless battery communication circuitry 210, the wireless battery control circuitry 212, the vehicle communication circuitry 214, the third storage 216, and/or, more generally, the wireless battery management control circuitry 202, the communication interface circuitry 218A-H, the monitoring circuitry 220A-H, the battery balance control circuitry 222A-H, the battery balance circuitry 224A-H, the fourth storage 227A-H, and/or, more generally, the battery circuitry 204A-H, may be implemented by one or more analog or digital circuit(s), logic circuits, programmable processor(s), programmable controller(s), GPU(s), DSP(s), ASIC(s), PLD(s), and/or FPLD(s). In some examples, the third storage 216 and/or the fourth storage 227A-H may be implemented with non-volatile memory (e.g., EEPROM, flash memory, etc.) and/or volatile memory (e.g., SDRAM, DRAM, RDRAM®, and/or any other type of random access memory device).

In some examples, each instance of the battery circuitry 204A-H may implement a battery node. For example, a first battery node may be implemented by first communication interface circuitry 218A of the communication interface circuitry 218A-H, first monitoring circuitry 220A of the monitoring circuitry 220A-H, first battery balance control circuitry 222A of the battery balance control circuitry 222A-H, first battery balance circuitry 224A of the battery balance circuitry 224A-H, a first battery 226A of the batteries 226A-H, a first storage instance 227A of the fourth storage 227A-H, and/or a first transceiver 228A of the transceivers 228A-H. In this example, there are 8 battery nodes each corresponding to instances of the communication interface circuitry 218A-H, the monitoring circuitry 220A-H, the battery balance control circuitry 222A-H, the battery balance circuitry 224A-H, the batteries 226A-H, the fourth storage 227A-H, and/or the transceivers 228A-H as described above for the first battery node. Alternatively, there may be fewer or more battery nodes than the 8 battery nodes depicted in the example of FIGS. 2A-2B.

In this example, input(s) and/or output(s) of the communication interface circuitry 218A-H is/are coupled to respective output(s) and/or input(s) the transceiver 228A-H. Input(s) and/or output(s) of the communication interface circuitry 218A-H is/are coupled to respective output(s) and/or input(s) of the monitoring circuitry 220A-H. Input(s) and/or output(s) of the monitoring circuitry 220A-H is/are coupled to respective output(s) and/or input(s) of the battery balance control circuitry 222A-H. Input(s) and/or output(s) of the battery balance control circuitry 222A-H is/are coupled to respective output(s) and/or input(s) of the battery balance circuitry 224A-D. Input(s) and/or output(s) of the battery balance circuitry 224A-H is/are coupled to the batteries 226A-H. In this example, the communication interface circuitry 218A-H, the monitoring circuitry 220A-H, the battery balance control circuitry 222A-H, and the battery balance circuitry 224A-H are coupled to the fourth storage 227A-H.

The wireless battery management control circuitry 202 includes the vehicle communication circuitry 214 to interface with the ECU 208 and/or, more generally, the vehicle 100 of FIG. 1 (e.g., one or more other ECUs than the ECU 208, a vehicle actuator, a vehicle infotainment system, etc.). For example, the vehicle communication circuitry 214 may deliver and/or otherwise transmit data, measurements, etc., associated with the battery circuitry 204A-H and/or the batteries 226A-H to the ECU 208 by the vehicle communication bus 206. In some such examples, the vehicle communication circuitry 214 may deliver and/or otherwise report battery performance and other battery parameters from one(s) of the batteries 226A-H. For example, the vehicle communication circuitry 214 may generate an alert, which may include the battery performance and other battery parameters. In some examples, the vehicle communication circuitry 214 may receive commands, instructions, etc., from the ECU 208 by the vehicle communication bus 206 to control operation of one(s) of the battery circuitry 204A-H.

The wireless battery management control circuitry 202 includes the wireless battery control circuitry 212 to monitor and/or control operation of the battery circuitry 204A-H. For example, the wireless battery control circuitry 212 may instruct the wireless battery communication circuitry 210 to transmit data frames (e.g., wakeup data frames, keep alive data frames, downlink commands, downlink data frames, etc.) to one(s) of the battery circuitry 204A-H. In some such examples, the data frames may include a request for data, measurements, etc., associated with the batteries 226A-H such as amperage, voltage, and/or temperature measurements. In some examples, the data frames may include a command, a direction, an instruction, etc., to implement a battery balance or maintenance operation, which may include balancing charge levels of one(s) of the batteries 226A-H by the battery balance circuitry 224A-H.

In some examples, the wireless battery control circuitry 212 may reduce power consumption of the wireless battery system 200 by implementing a node skipping technique (e.g., a node transmit (TX) skipping technique). For example, the wireless battery control circuitry 212 may instruct a battery node to transmit a data frame every N superframes and skip transmission of the data frame otherwise. For example, the wireless battery control circuitry 212 may generate a downlink command to instruct one(s) of the battery nodes (e.g., one(s) of the battery circuitry 204A-H or portion(s) thereof) to transmit an uplink command (also referred to herein as an uplink frame or data frame) at every N superframes. In some such examples, the wireless battery control circuitry 212 may invoke the wireless battery communication circuitry 210 to transmit the downlink command to the battery nodes by the transceiver 217. In some such examples, in response to receiving the downlink command during a first superframe interval, the first battery node may transmit a first uplink command during the first superframe interval, a second battery node may transmit a second uplink command during a second superframe interval after the first superframe interval, etc.

In some examples, the wireless battery control circuitry 212 may improve fault detection of the wireless battery system 200 by reconstructing a superframe based on uplink allocations of the superframe and a downlink allocation of a subsequent superframe. For example, the wireless battery control circuitry may implement a superframe reconstruction technique by redefining and/or otherwise implementing the superframe based on the uplink allocations of the superframe and the downlink allocation of the subsequent superframe. For example, the wireless battery control circuitry 212 may reconstruct the superframe in response to receiving uplink commands from the battery nodes at a first time in the superframe interval and transmitting a downlink command to the battery nodes at a second time after the first time in the superframe interval.

In some examples, the wireless battery control circuitry 212 may improve network formation of the wireless battery system 200 by interleaving superframe intervals between fast sequence wakeup data frames. For example, the wireless battery control circuitry 212 may implement an alternating interval type technique based on the interleavings.

In some examples, the wireless battery control circuitry 212 may detect whether an anomaly or unexpected operation is associated with one(s) of the battery nodes 204A-H. For example, in response to receiving an uplink command from the first battery node 204A, the wireless battery control circuitry 212 may determine whether an anomaly is detected in battery performance and/or operation (e.g., a detected amperage, a voltage, and/or temperature is higher than respective amperage, voltage, and/or temperature thresholds, etc.). In some examples, in response to a determination that the anomaly is detected, the wireless battery control circuitry 212 may determine that the received uplink is to be acted upon based on data included in and/or otherwise indicated by the received uplink (e.g., lower temperature, mitigate amperage and/or voltage increase, etc.), the wireless battery control circuitry 212 may cause a responsive action to occur (e.g., turn on a fan to cool the first battery 226A, execute a rebalance operation, etc.).

The wireless battery management control circuitry 202 includes the wireless battery communication circuitry 210 to control the transceiver 217 to transmit data to and/or receive data from the battery nodes. In some examples, the wireless battery communication circuitry 210 may invoke the transceiver 217 to transmit a downlink command, an instruction, etc., to the battery circuitry 204A-H. In some such examples, the command, the instruction, etc., may include a request for measurements associated with the batteries 226A-H, which may include a current, a voltage, and/or a temperature of the batteries 226A-H. In some examples, the command, the instructions, etc., may include a balance command to rebalance charge levels of the batteries 226A-H by the battery balance circuitry 224A-H.

The wireless battery management control circuitry 202 includes the third storage 216 to store data. For example, the third storage 216 may store data received by the wireless battery communication circuitry 210, the wireless battery control circuitry 212, and/or the vehicle communication circuitry 214.

The battery circuitry 204A-H includes the communication interface circuitry 218A-H to receive and/or transmit data. In some examples, the communication interface circuitry 218A-H may implement the communication interface circuitry 138 of FIG. 1 or portion(s) thereof. In some examples, the communication interface circuitry 218A-H may receive data (e.g., a data frame, a downlink command, etc.), which may include a command or a request for data, from the wireless battery management control circuitry 202 by the transceivers 217, 228A-H. In some examples, the communication interface circuitry 218A-H may transmit data (e.g., a data frame, an uplink command, etc.), which may include measurement data associated with the batteries 226A-H or an acknowledgment of a receipt or completion of the command, to the wireless battery management control circuitry 202 by the transceivers 217, 228A-H.

The battery circuitry 204A-H includes the monitoring circuitry 220A-H to monitor and/or otherwise control operation of the batteries 226A-H. In some examples, the monitoring circuitry 220A-H measures a condition, a parameter, etc., associated with the batteries 226A-H, which may include a current, a voltage, a temperature, etc. In some such examples, the monitoring circuitry 220A-H may measure the condition, the parameter, etc., by obtaining the measurement from the battery balance control circuitry 222A-H. In some examples, the monitoring circuitry 220A-H determines a state of charge and/or a depth of charge of one(s) of the batteries 226A-H based on an amperage measurement, a voltage measurement, etc., measured by the monitoring circuitry 220A-H, the battery balance control circuitry 222A-H, and/or the battery balance circuitry 224A-H.

The battery circuitry 204A-H includes the battery balance control circuitry 222A-H to monitor and/or control balancing operations associated with the batteries 226A-H. In some examples, the battery balance control circuitry 222A-H obtains measurements associated with the batteries 226A-H, which may include a current (e.g., an amperage measurement), a voltage (e.g., a voltage measurement), a temperature (e.g., a temperature measurement), etc., associated with one(s) of the batteries 226A-H. In some such examples, the battery balance circuitry 224A-H may include one or more current, voltage, and/or temperature sensors or associated sensor circuitry.

In some examples, the battery balance control circuitry 222A-H may control the battery balance circuitry 224A-H to rebalance charge levels of one(s) of the batteries 226A-H. For example, the battery balance circuitry 224A-H may be implemented by passive battery balancing circuitry or an active battery balancing circuitry as described above in connection with FIG. 1. In some such examples, the battery balance circuitry 224A-H may be implemented by passive battery balancing circuitry such as a fixed shunt resistor circuit and/or a Zener diode/fixed shunt resistor circuit. In some examples, the battery balance circuitry 224A-H may be implemented by active battery balancing circuitry such as a switch and capacitor circuit or a switch and switched transformer circuit.

The battery circuitry 204A-H includes the fourth storage 227A-H to store data. For example, the fourth storage 227A-H may store data received by the communication interface circuitry 218A-H and/or the monitoring circuitry 220A-H. In some examples, the fourth storage 227A-H may receive data obtained and/or otherwise measured by the battery balance control circuitry 222A-H by the battery balance circuitry 224A-H.

Advantageously, the wireless battery system 200 of the illustrated example of FIGS. 2A-2B may reduce battery system cost, and/or, more generally, vehicle cost, battery repair and replacement complexity, and vehicle weight (which may increase a fuel efficiency of the vehicle) compared to the battery system 104 of FIG. 1. Advantageously, the wireless battery system 200 of the illustrated example of FIGS. 2A-2B may improve battery life cycle longevity by reducing power consumption during system operation compared to the battery system 104 of FIG. 1.

While an example manner of implementing the wireless battery management circuitry 202 is illustrated in FIGS. 2A-2B, one or more of the elements, processes and/or devices illustrated in FIGS. 2A-2B may be combined, divided, re-arranged, omitted, eliminated and/or implemented in any other way. Further, the example wireless battery communication circuitry 210, the wireless battery control circuitry 212, the vehicle communication circuitry 214, the third storage 216, the transceiver 217, and/or, more generally, the example wireless battery management control circuitry 202 of FIGS. 2A-2B may be implemented by hardware, software, firmware and/or any combination of hardware, software and/or firmware. Thus, for example, any of the example wireless battery communication circuitry 210, the wireless battery control circuitry 212, the vehicle communication circuitry 214, the third storage 216, the transceiver 217, and/or, more generally, the example wireless battery management control circuitry 202 of FIGS. 2A-2B could be implemented by one or more analog or digital circuit(s), logic circuits, programmable processor(s), programmable controller(s), GPU(s), DSP(s), ASIC(s), PLD(s), and/or FPLD(s). When reading any of the apparatus or system claims of this patent to cover a purely software and/or firmware implementation, at least one of the example wireless battery communication circuitry 210, the wireless battery control circuitry 212, the vehicle communication circuitry 214, the third storage 216, and/or the transceiver 217 is/are hereby expressly defined to include a non-transitory computer readable storage device or storage disk such as a memory, a digital versatile disk (DVD), a compact disk (CD), a Blu-ray disk, etc., including the software and/or firmware. Further still, the example wireless battery management control circuitry 202 of FIGS. 2A-2B may include one or more elements, processes and/or devices in addition to, or instead of, those illustrated in FIGS. 2A-2B, and/or may include more than one of any or all of the illustrated elements, processes and devices.

While an example manner of implementing the battery circuitry 204A-H is illustrated in FIGS. 2A-2B, one or more of the elements, processes and/or devices illustrated in FIGS. 2A-2B may be combined, divided, re-arranged, omitted, eliminated and/or implemented in any other way. Further, the example communication interface circuitry 218A-H, the monitoring circuitry 220A-H, the battery balance control circuitry 222A-H, the battery balance circuitry 224A-H, and/or, more generally, the battery circuitry 204A-H may be implemented by hardware, software, firmware and/or any combination of hardware, software and/or firmware. Thus, for example, any of the example communication interface circuitry 218A-H, the monitoring circuitry 220A-H, the battery balance control circuitry 222A-H, the battery balance circuitry 224A-H, and/or, more generally, the battery circuitry 204A-H could be implemented by one or more analog or digital circuit(s), logic circuits, programmable processor(s), programmable controller(s), GPU(s), DSP(s), ASIC(s), PLD(s), and/or FPLD(s). When reading any of the apparatus or system claims of this patent to cover a purely software and/or firmware implementation, at least one of the example communication interface circuitry 218A-H, the monitoring circuitry 220A-H, the battery balance control circuitry 222A-H, and/or the battery balance circuitry 224A-H is/are hereby expressly defined to include a non-transitory computer readable storage device or storage disk such as a memory, a DVD, a CD, a Blu-ray disk, etc., including the software and/or firmware. Further still, the example battery circuitry 204A-H of FIGS. 2A-2B may include one or more elements, processes and/or devices in addition to, or instead of, those illustrated in FIGS. 2A-2B, and/or may include more than one of any or all of the illustrated elements, processes and devices.

Figure 3:
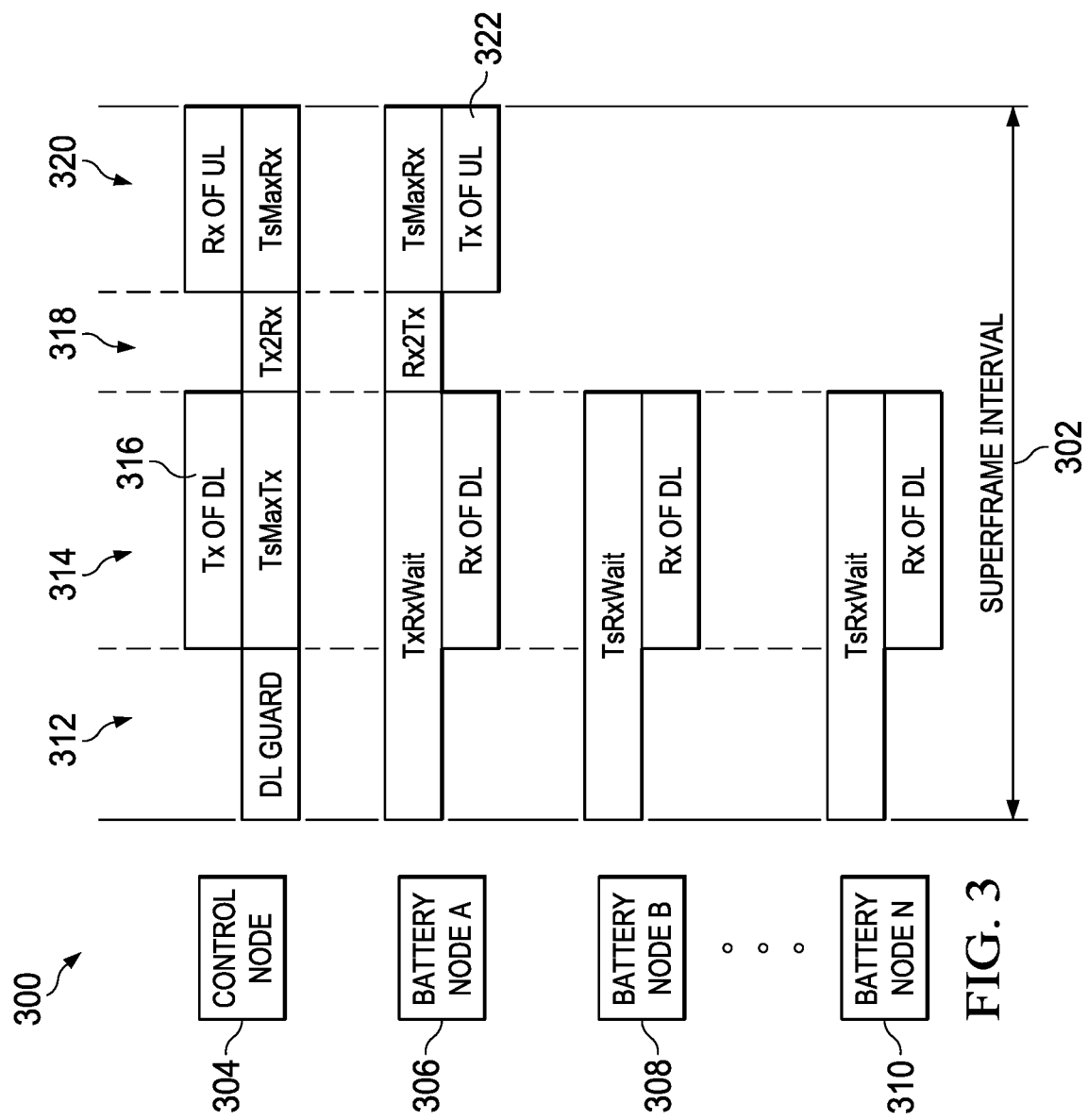
FIGS. 3-5 depict timing diagrams of example superframe intervals as orchestrated by the example wireless battery management control circuitry of FIGS. 2A-2B based on a node skipping technique.

FIG. 3 depicts a first timing diagram 300 of a first example superframe interval 302 as orchestrated by the wireless battery management control circuitry 202 of FIGS. 2A-2B based on a node skipping technique. Advantageously, the wireless battery management control circuitry 202 of FIGS. 2A-2B may implement the node skipping technique to achieve power savings in one or more of the batteries 226A-H, and/or, more generally, the wireless battery system 200 of FIGS. 2A-2B.

The first timing diagram 300 includes communication operations associated with an example control node 304, a first example battery node (BATTERY NODE A) 306, a second example battery node (BATTERY NODE B) 308, and a third example battery node (BATTERY NODE N) 310. For example, the control node 304 may be implemented by the wireless battery management control circuitry 202 of FIGS. 2A-2B or portion(s) thereof. In some examples, the first battery node 306 may be implemented by first battery circuitry 204A of the battery circuitry 204A-H of FIGS. 2A-2B or portion(s) thereof. In some examples, the second battery node 308 may be implemented by second battery circuitry 204B of the battery circuitry 204A-H of FIGS. 2A-2B or portion(s) thereof. In some examples, the third battery node 310 may be implemented by third battery circuitry 204C of the battery circuitry 204A-H of FIGS. 2A-2B or portion(s) thereof.

In example operation, the control node 304 and/or one(s) of the battery nodes 306, 308, 310 may implement a node skipping technique by transmitting keep alive frames, command, etc., every N superframes and, at other times, the control node 304 and/or the one(s) of the battery nodes 306, 308, 310 may go to sleep, enter a sleep mode or standby mode, etc. In example operation, the control node 304 may identify one(s) of the battery nodes 306, 308, 310 for communication. In some examples, if only a subset of the battery nodes 306, 308, 310 is to be in communication with the control node 304, the control node 304 may identify the subset of the total available battery nodes. In some such examples, the control node 304 may instruct which one(s) of the battery nodes 306, 308, 310 is to communicate and at what time during the first superframe interval 302.

In example operation, the control node 304 may identify during a first example time interval 312 that the first battery node 306 is to transmit an uplink command during the first superframe interval 302 and at which point during the first superframe interval 302 that the first battery node 306 may transmit an uplink command. The first time interval 312 may be implemented by a download (DL) guard band. During a second example time interval 314, the control node 304 may transmit a first example downlink command 316 to the battery nodes 306, 308, 310 during a transmit frame (TsMaxTx). During the second time interval 314, the battery nodes 306, 308, 310 may receive the downlink command during a receive frame (TsRxWait). A third example time interval 318 between the second time interval 314 and a fourth example time interval 320 is implemented by a switch in operation states of the control node 304 and the first battery node 306. For example, during the third time interval 318, the control node 304 switches from a transmit to a receive state (Tx2Rx) and the first battery nodes 306 switches from a receive to a transmit state (Rx2Tx). During the fourth time interval 320, the first battery node 306, which is identified by the control node 304 to transmit a first example uplink command 322, transmits the first uplink command 322 to the control node 304. During the fourth time interval 320, the control node 304 and the first battery node 306 are in an active or enabled state while the second battery node 308 and the third battery node 310 are in a disabled or standby mode (e.g., the second battery node 308 and the third battery node 310 are sleeping and/or otherwise not awake).

Advantageously, the control node 304 may implement the node skipping technique illustrated in the first timing diagram 300 of FIG. 3 by causing only a portion of the battery nodes 306, 308, 310 to transmit an uplink command during the first superframe interval 302. Advantageously, by causing the other portion of the battery nodes 306, 308, 310 to not transmit an uplink command, the control node 304 may achieve power savings in the wireless battery system 200 by instructing only a portion of the battery nodes 306, 308, 310 to stay awake and/or otherwise remain active during transmission of the first uplink command 322.

Figure 4:
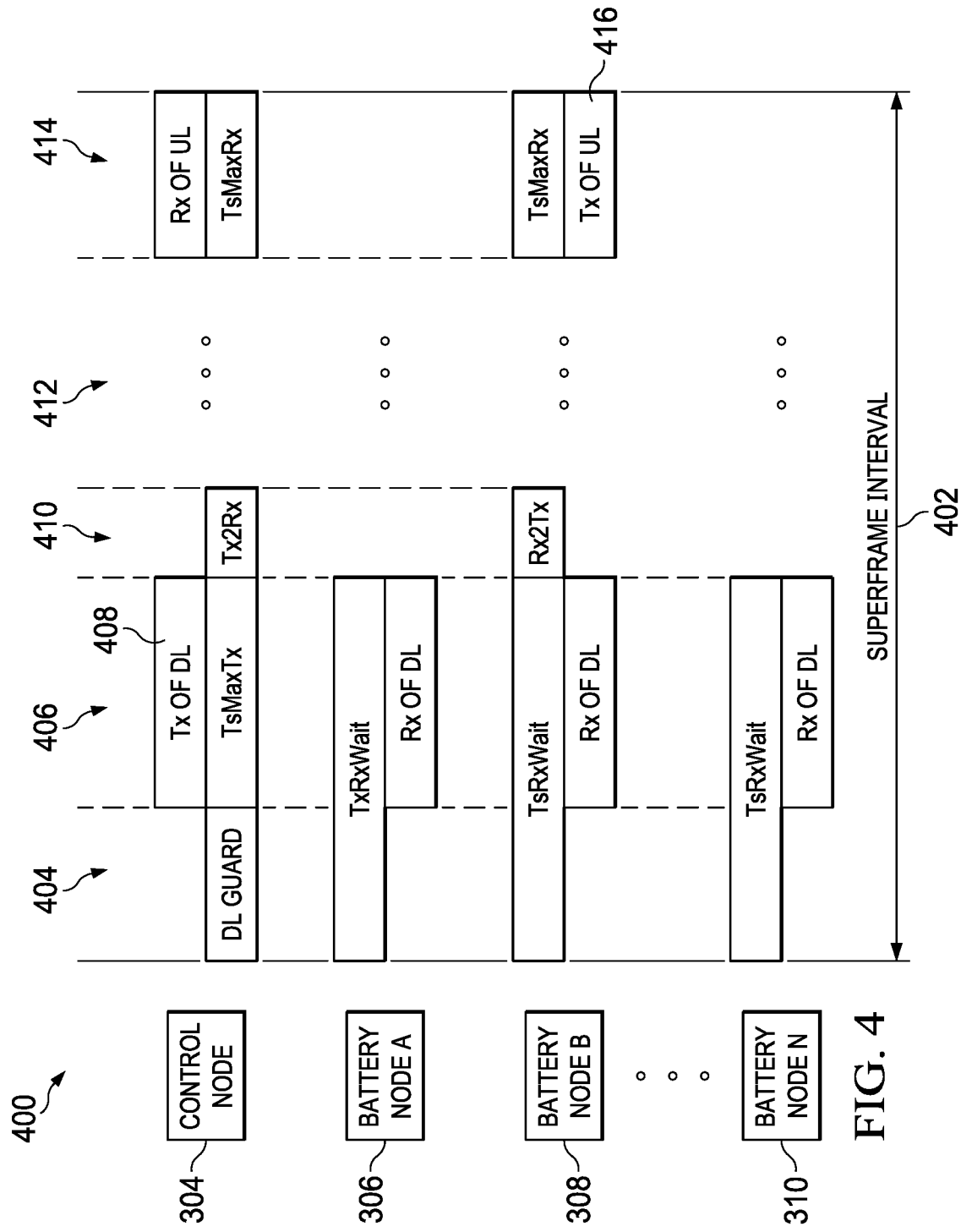

FIG. 4 depicts a second timing diagram 400 of a second example superframe interval 402 as orchestrated by the wireless battery management control circuitry 202 of FIGS. 2A-2B based on a node skipping technique. In some examples, the second superframe interval 402 may be after the first superframe interval 302 of FIG. 3. The second timing diagram 400 includes communication operations associated with the control node 304, the first battery node 306, the second battery node 308, and the third battery node 310 of FIG. 3.

In example operation, the control node 304 may identify one(s) of the battery nodes 306, 308, 310 for communication. In the example of the second timing diagram 400 during a first example time interval 404, the control node 304 may identify the second battery node 308 for communication and/or at what time during the second superframe interval 402 that the second battery node 308 is to transmit an uplink command, an uplink date frame, etc., to the control node 304. The first time interval 404 may be implemented by a DL guard band. During a second example time interval 406 after the first time interval 404, the control node 304 may transmit a second example downlink command 408 to the battery nodes 306, 308, 310 during a transmit frame (TsMaxTx). For example, the second downlink command 408 may be transmitted and/or otherwise broadcasted by the control node 304 after the first downlink command 316 of FIG. 3.

During the second time interval 406, the battery nodes 306, 308, 310 may receive the second downlink command 408 during a receive frame (TsRxWait). A third example time interval 410 between the second time interval 406 and a fourth example time interval 412 is implemented by a switch in operation states of the control node 304 and the second battery node 308. For example, during the third time interval 410, the control node 304 switches from a transmit to a receive state (Tx2Rx) and the second battery node 308 switches from a receive to a transmit state (Rx2Tx). In the example of the second timing diagram 400, one(s) of the control node 304 and/or the battery nodes 306, 308, 310 are inactive and/or otherwise in a sleep or standby mode or state during the fourth time interval 412.

In example operation, during a fifth example time interval 414 after the fourth time interval 412, the second battery node 308, which is identified by the control node 304 to transmit a second example uplink command 416, transmits the second uplink command 416 to the control node 304. For example, the second uplink command 416 may be transmitted and/or otherwise broadcasted by the second battery node 308 after the first uplink command 322 of FIG. 3. During the fifth time interval 414, the control node 304 and the second battery node 308 are in an active mode or enabled mode or state while the first battery node 306 and the third battery node 310 are in a disabled or standby mode or state (e.g., the first battery node 306 and the third battery node 310 are sleeping and/or otherwise not awake).

Advantageously, the control node 304 may implement the node skipping technique illustrated in the second timing diagram 400 of FIG. 4 by causing only a portion of the battery nodes 306, 308, 310 to transmit an uplink command during the second superframe interval 402. Advantageously, by causing the other portion of the battery nodes 306, 308, 310 to not transmit an uplink command, the control node 304 may achieve power savings in the wireless battery system 200 by instructing only a portion of the battery nodes 306, 308, 310 to stay awake and/or otherwise remain active during transmission of the second uplink command 416.

Figure 5:
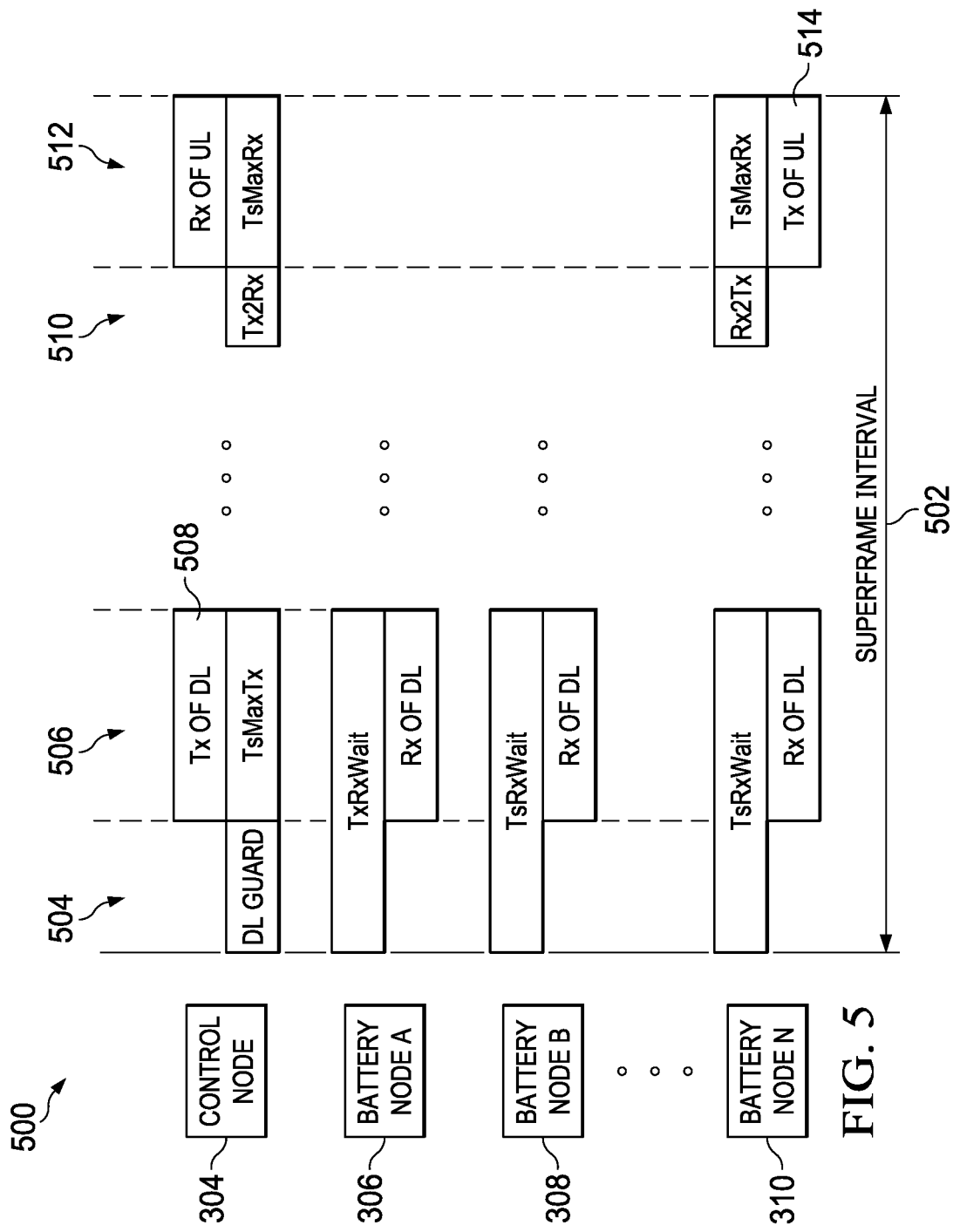

FIG. 5 depicts a third timing diagram 500 of a third example superframe interval 502 as orchestrated by the wireless battery management control circuitry 202 of FIGS. 2A-2B based on a node skipping technique. In some examples, the third superframe interval 502 may be after the first superframe interval 302 of FIG. 3 and/or after the second superframe interval 402 of FIG. 4. The third timing diagram 500 includes communication operations associated with the control node 304, the first battery node 306, the second battery node 308, and the third battery node 310 of FIGS. 3 and/or 4.

In example operation, the control node 304 may identify one(s) of the battery nodes 306, 308, 310 for communication. In the example of the third timing diagram 500 during a first example time interval 504, the control node 304 may identify the third battery node 310 for communication and/or at what time during the third superframe interval 502 that the third battery node 310 is to transmit an uplink command, an uplink date frame, etc., to the control node 304. The first time interval 504 may be implemented by a DL guard band. During a second example time interval 506 after the first time interval 504, the control node 304 may transmit a third example downlink command 508 to the battery nodes 306, 308, 310 during a transmit frame (TsMaxTx). For example, the third downlink command 508 may be transmitted and/or otherwise broadcasted by the control node 304 after the first downlink command 316 of FIG. 3 and/or the second downlink command 408 of FIG. 4.

During the second time interval 506, the battery nodes 306, 308, 310 may receive the third downlink command 508 during a receive frame (TsRxWait). A third example time interval 510 between the second time interval 506 and a fourth example time interval 512 (e.g., from the end of the second time interval 506 until the beginning of the fourth time interval 512) is implemented by a switch in operation states of the control node 304 and the third battery node 310. For example, during the third time interval 510, the control node 304 switches from a transmit to a receive state (Tx2Rx) and the third battery node 310 switches from a receive to a transmit state (Rx2Tx).

In example operation, during the fourth time interval 512, the third battery node 310, which is identified by the control node 304 to transmit a third example uplink command 514, transmits the third uplink command 514 to the control node 304. For example, the third uplink command 514 may be transmitted and/or otherwise broadcasted by the third battery node 310 after the first uplink command 322 of FIG. 3 and/or the second uplink command 416 of FIG. 4. During the fourth time interval 512, the control node 304 and the third battery node 310 are in an active or enabled mode or state while the first battery node 306 and the second battery node 308 are in a disabled or standby mode or state (e.g., the first battery node 306 and the second battery node 308 are sleeping and/or otherwise not awake).

Advantageously, the control node 304 may implement the node skipping technique illustrated in the third timing diagram 500 of FIG. 5 by causing only a portion of the battery nodes 306, 308, 310 to transmit an uplink command during the third superframe interval 502. Advantageously, by causing the other portion of the battery nodes 306, 308, 310 to not transmit an uplink command, the control node 304 may achieve power savings in the wireless battery system 200 by instructing only a portion of the battery nodes 306, 308, 310 to stay awake and/or otherwise remain active during transmission of the third uplink command 514.

Figure 6:
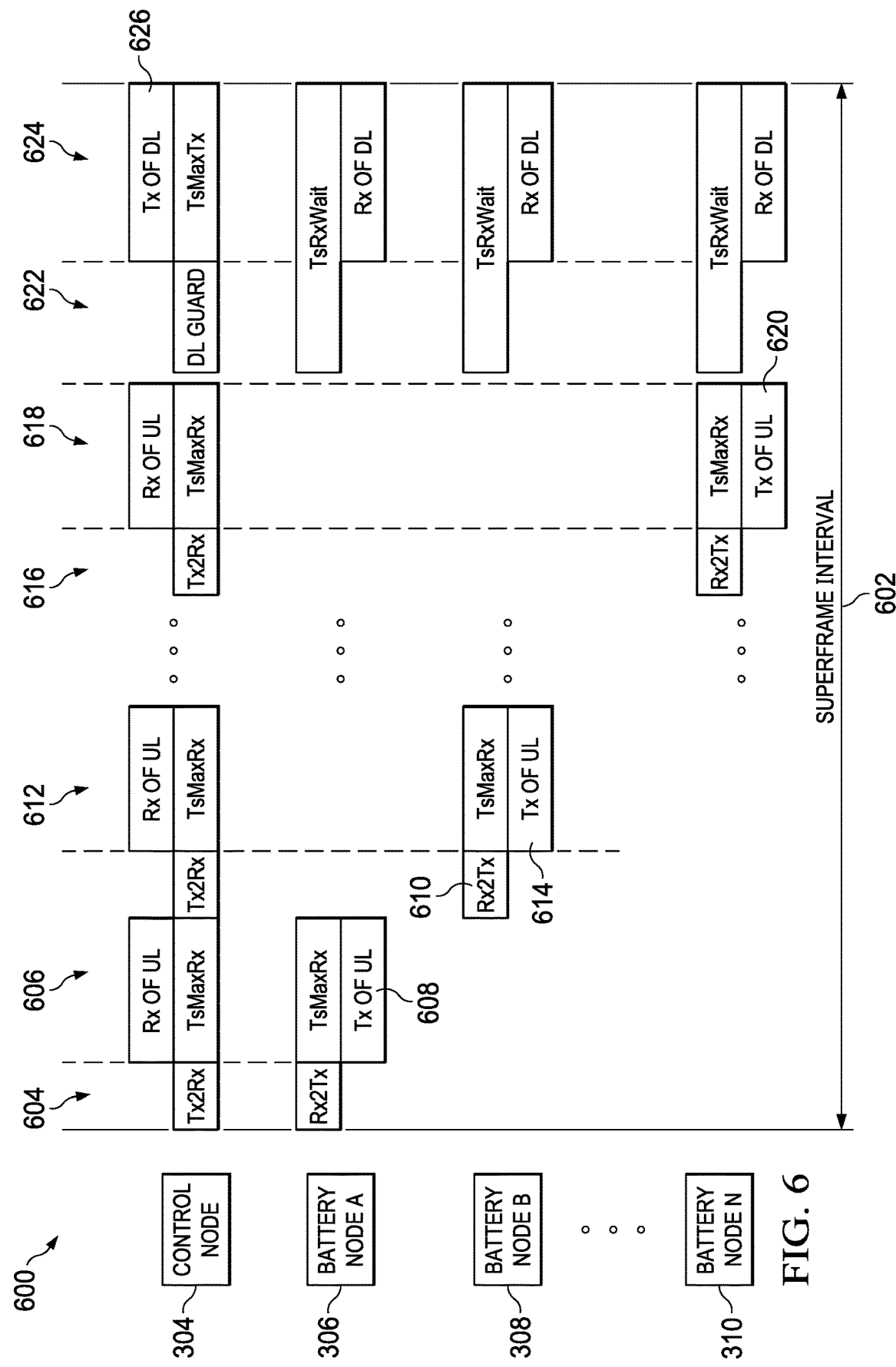
FIG. 6 is a timing diagram of an example superframe interval as orchestrated by the example wireless battery management control circuitry of FIGS. 2A-2B based on a superframe reconstruction technique.

FIG. 6 is a fourth timing diagram 600 of a fourth example superframe interval 602 as orchestrated by the example wireless battery management control circuitry 212 of FIGS. 2A-2B based on a superframe reconstruction technique. The fourth timing diagram 700 includes communication operations associated with the control node 304, the first battery node 306, the second battery node 308, and the third battery node 310 of FIGS. 3, 4, and/or 5.

In the example of the fourth timing diagram 600, the control node 304 and/or one(s) of the battery nodes 306, 308, 310 may implement a superframe reconstruction technique by reconstructing the fourth superframe interval 602 from the uplink allocations of one superframe and the downlink allocation of a subsequent superframe. Advantageously, the control node 304 and/or one(s) of the battery nodes 306, 308, 310 may implement the superframe reconstruction technique to improve fault detection associated with the one(s) of the battery nodes 306, 308, 310. For example, if one(s) of the battery nodes 306, 308, 310 report an issue (e.g., generate an uplink command including data indicative of a fault, an error, etc.), then the control node 304 may determine whether to obtain measurements associated with the battery nodes 306, 308, 310 and/or execute a cell balancing operation associated with the battery nodes 306, 308, 310.

In example operation, during a first example time interval 604, the control node 304 switches from a transmit to a receive state (Tx2Rx) and the first battery node 306 switches from a receive to a transmit state (Rx2Tx). During a second example time interval 606, the control node 304 receives a first example uplink command 608 from the first battery node 306. During a third example time interval 610, the second battery node 308 switches from a receive state to a transmit state (Rx2Tx). During a fourth example time interval 612, the control node 304 receives a second example uplink command 614 from the second battery node 308.

In example operation, during a fifth example time interval 616, the third battery node 310 switches from a receive to a transmit state (Rx2Tx). During a sixth example time interval 618, the control node 304 receives a third example uplink command 620 from the third battery node 310. During a seventh example time interval 622, the control node 304 generates a first example downlink command 626, which may include instruction(s) to invoke one(s) of the battery nodes 306, 308, 310 to transmit uplink command(s) and at what time(s) during a superframe interval in which to transmit the uplink command(s).

In example operation, during an eighth example time interval 624, the control node 304 transmits the first downlink command 626 to the battery nodes 306, 308, 310. In the example of the fourth timing diagram 600 of FIG. 6, the fourth superframe interval 602 spans from the first time interval 604 through the eighth time interval 624. Advantageously, by reconstructing a start of a superframe by utilizing the uplink communications of the battery nodes 306, 308, 310 and an end of the superframe by utilizing the downlink communications of the control node 304, the control node 304 may achieve improved fault detection of one(s) of the battery nodes 306, 308, 310.

Figure 7:
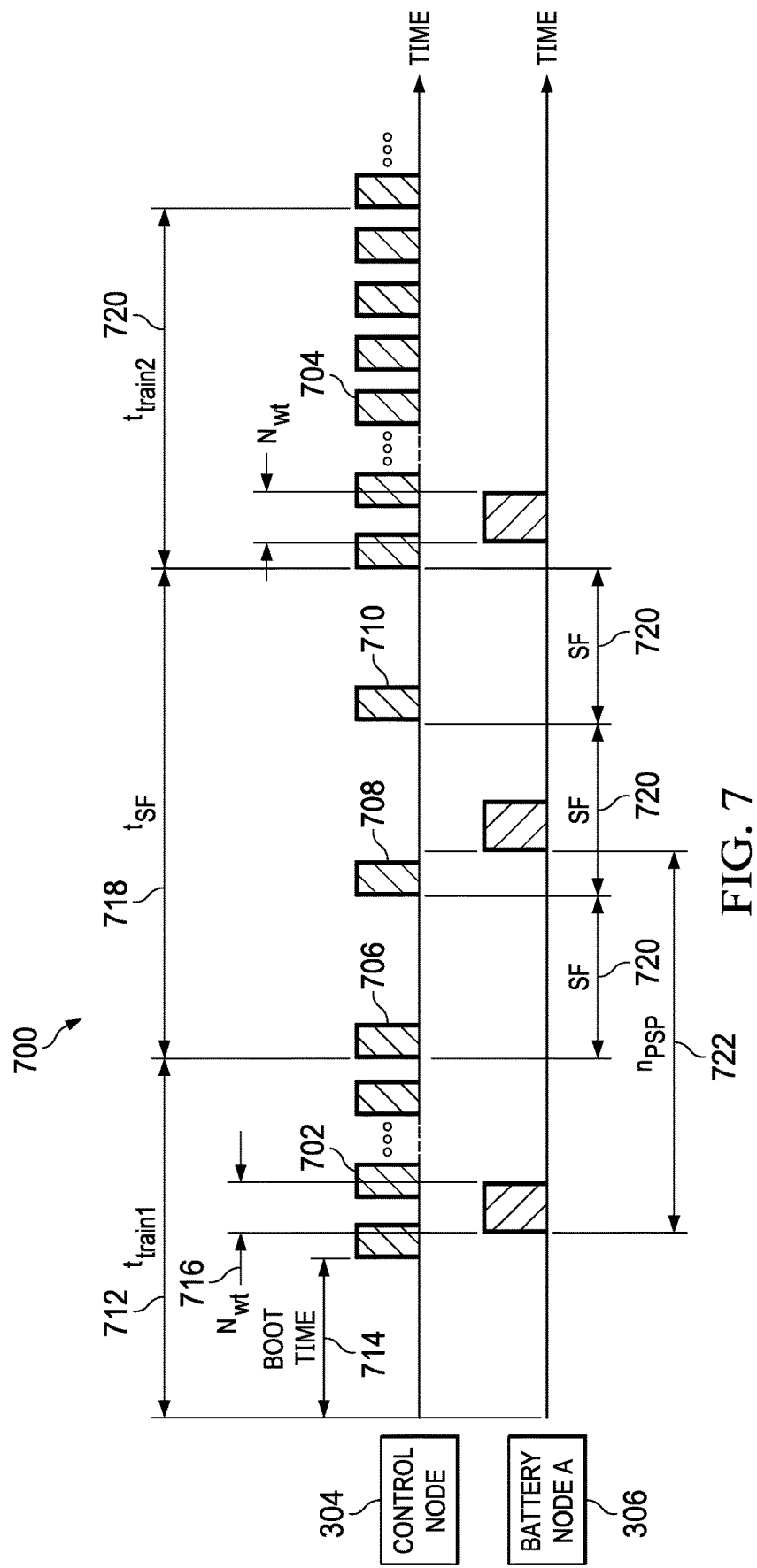
FIG. 7 is a timing diagram of example wakeup train intervals and example superframe intervals as orchestrated by the example wireless battery management control circuitry of FIGS. 2A-2B based on an example alternating interval type technique.

FIG. 7 is a fifth timing diagram 700 of example wakeup train packets 702, 704 and example superframe packets 706, 708, 710 as orchestrated by the wireless battery management control circuitry 202 of FIGS. 2A-2B based on an example alternating interval type technique. The fifth timing diagram 700 includes communication operations associated with the control node 304 and the first battery node 306 of FIGS. 3, 4, 5, and/or 6.

In the example of the fifth timing diagram 700, the control node 304 may implement an example alternating interval type technique by broadcasting a wakeup train of packets, followed by superframe intervals and another train of wakeup packets. In this example, nodes, such as the first battery node 306, may infrequently sense and/or otherwise monitor a medium for the wakeup train of packets. Advantageously, the time duration for sensing the medium may be relatively small but sufficient to detect the transmission of the wakeup packets. Advantageously, the control node 304 may achieve faster and/or otherwise improved network formation by interleaving superframe intervals between trains of wakeup packets.

In example operation, the control node 304 is shut down, in a standby mode, etc., prior to a first example time interval ($t_{train1}$) 712, which in this example is a first wakeup train time duration. During the first time interval 712, the control node 304 wakes up and/or otherwise boots up during an example boot time 714 of the first time interval 712. In response to booting up, the control node 304 broadcasts a train of wakeup packets during the first time interval 712. The control node 304 may broadcast one(s) of the wakeup packets at a first frequency during the first time interval. In this example, the first battery node 306 is active and/or otherwise senses the wireless communication medium during a first example wakeup time interval ($N_{wt}$) 716.

During an example superframe time duration ($t_{SF}$) 718, the control node 304 transmits the superframe packets 706, 708, 710 at example superframe (SF) intervals 720. The control node 304 may broadcast one(s) of the superframe packets 706, 708, 710 at a second frequency less than the first frequency during the superframe time duration 718. During the superframe time duration 718, the first battery node 306 wakes up and senses the wireless communication medium. An example interval between wake up operations of the first battery node 306 is depicted as $n_{PSP}$ 722. After the superframe time duration 718, the control node 304 broadcasts another train or set of wakeup packets 704 (FIG. 7) during a third example time duration ($t_{train2}$) 720. Advantageously, by breaking up fast sequence frames, such as wakeup train packets, to include and/or otherwise interleave superframe intervals, the control node 304 may achieve faster network formation in wireless battery systems, such as the wireless battery system 200 of FIGS. 2A-2B.

Flowcharts representative of example hardware logic circuitry, machine readable instructions, hardware implemented state machines, and/or any combination thereof for implementing the wireless battery management control circuitry 202 and/or the battery circuitry 204A-H of FIGS. 2A-2B is shown in FIGS. 8-11. The machine readable instructions may be one or more executable programs or portion(s) of an executable program for execution by processor circuitry, such as the processor circuitry 1212 shown in the example processor platform 1200 discussed below in connection with FIG. 12, the processor circuitry 1312 shown in the processor platform 1300 discussed below in connection with FIG. 13, and/or the example processor circuitry discussed below in connection with FIGS. 14 and/or 15. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 8-11, many other methods of implementing the example wireless battery management control circuitry 202 and/or the example battery circuitry 204A-H may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 8-11 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 8:
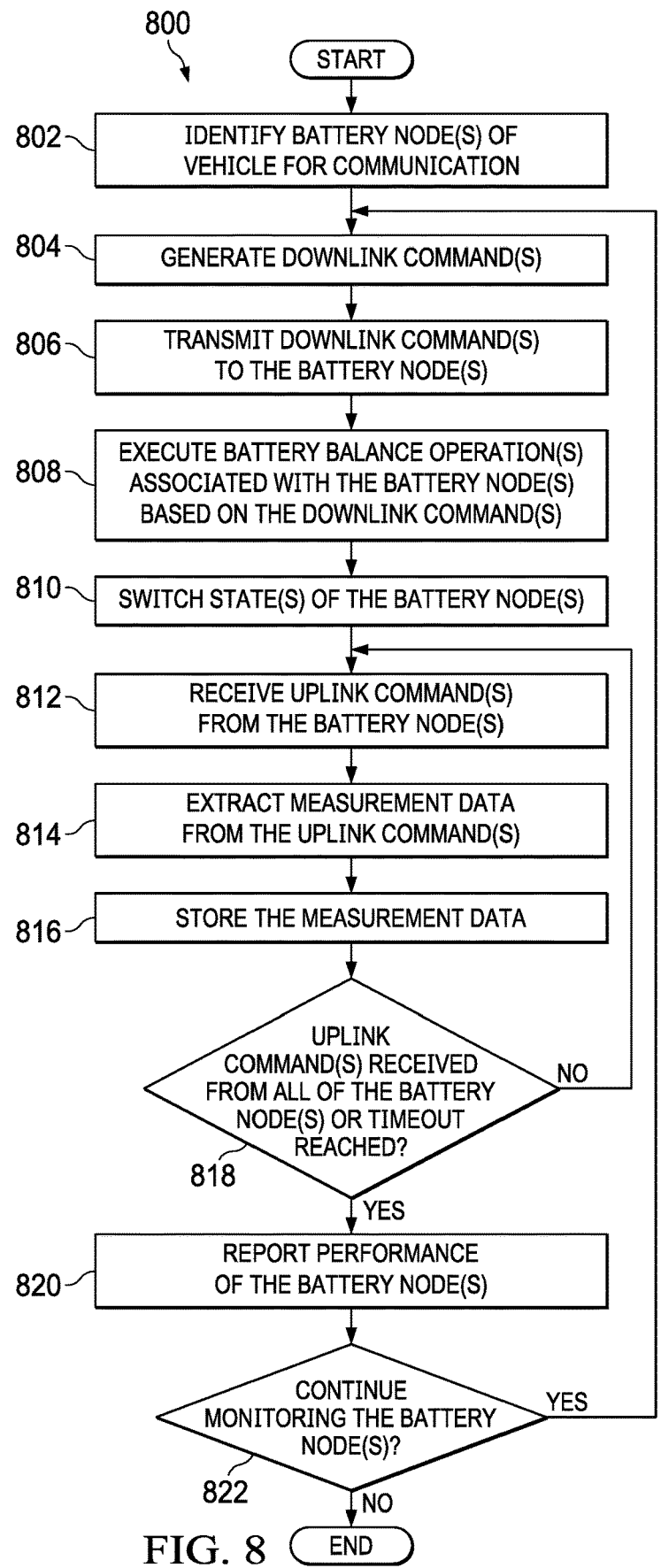
FIG. 8 is a flowchart representative of example machine readable instructions that may be executed to implement the example wireless battery management control circuitry and/or the example battery circuitry of FIGS. 2A-2B for power management of the example wireless battery system of FIGS. 2A-2B.

FIG. 8 is a flowchart representative of example machine readable instructions and/or example operations 800 that may be executed and/or instantiated by processor circuitry to achieve wireless battery management and/or control of batteries in a system, such as an EV, an HEV, etc. The machine readable instructions and/or operations 800 of FIG. 8 begin at block 802, at which the wireless battery management control circuitry 202 identifies battery node(s) of a vehicle for communication. For example, the wireless battery control circuitry 212 (FIGS. 2A-2B), which may implement a control node such as the control node 304 of FIGS. 3, 4, 5, 6, and/or 7, may identify the first battery circuitry 204A (FIGS. 2A-2B) and the second battery circuitry 204B (FIGS. 2A-2B) for communication, which may implement a respective one of the first battery node 306 and/or the second battery node 308 of FIGS. 3, 4, 5, 6, and/or 7.

At block 804, the wireless battery management control circuitry 202 generates downlink command(s). For example, the wireless battery control circuitry 212 may generate the first downlink command 316 (FIG. 3), which may include a request for measurements, an instruction to execute a rebalance operation, etc., and/or a combination thereof.

At block 806, the wireless battery management control circuitry 202 transmits downlink command(s) to the battery node(s). For example, the wireless battery control circuitry 212 may instruct the wireless battery communication circuitry 210 (FIGS. 2A-2B) to transmit the first downlink command 316 to the first battery circuitry 204A and the second battery circuitry 204B.

At block 808, the wireless battery management control circuitry 202 executes battery balance operation(s) associated with the battery node(s) based on the downlink command(s). For example, the wireless battery control circuitry 212 may cause the first battery balance control circuitry 222A and/or the second battery balance control circuitry 222B to invoke respective one(s) of the first battery balance circuitry 224A and/or the second battery balance circuitry 224B to execute a battery balance operation, a power adjustment operation, etc., associated with respective one(s) of the first battery 226A and/or the second battery 226B. In some such examples, the first downlink command 316 may include directions, instructions, etc., to implement the battery balance operation(s).

At block 810, the wireless battery management control circuitry 202 switches state(s) of the battery node(s). For example, the wireless battery control circuitry 212 may cause the first communication interface circuitry 218A and/or the second communication interface circuitry 218B to switch from a receive to a transmit state.

At block 812, the wireless battery management control circuitry 202 receive(s) uplink command(s) from the battery node(s). For example, the wireless battery communication circuitry 210 may receive by the transceiver 217 the first uplink command 322 of FIG. 3, the second uplink command 416 of FIG. 4, etc.

At block 814, the wireless battery management control circuitry 202 extracts measurement data from the uplink command(s). For example, the wireless battery control circuitry 212 may extract and/or otherwise identify measurement data, which may include amperage measurement(s), voltage measurement(s), temperature measurement(s), etc., and/or a combination thereof, from the first uplink command 322, the second uplink command 416, etc.

At block 816, the wireless battery management control circuitry 202 stores the measurement data. For example, at least one of the wireless battery communication circuitry 210 or the wireless battery control circuitry 212 may store the measurement data in the third storage 216 (FIGS. 2A-2B).

At block 818, the wireless battery management control circuitry 202 determines whether uplink command(s) are received from all of the battery node(s) or a timeout has been reached. For example, the wireless battery control circuitry 212 may determine that the first uplink command 322 has not been received during an expected time period (e.g., a timeout time period, a timeout timer, etc.) and thereby may identify an anomaly, an error, a fault, etc., associated with the first battery circuitry 204A, or portion(s) thereof.

If, at block 818, the wireless battery management control circuitry 202 determines that uplink command(s) is/are not received from all of the battery node(s) or the timeout is not reached, control returns to block 812 to continue to wait for the uplink command(s) from the battery node(s). If, at block 818, the wireless battery management control circuitry 202 determines that uplink command(s) is/are received from all of the battery node(s) or the timeout is reached, then, at block 820, the wireless battery management control circuitry 202 reports performance of the battery node(s). For example, the vehicle communication circuitry 214 (FIGS. 2A-2B) may retrieve performance data, measurement data, etc., corresponding to the first battery circuitry 204A and/or the second battery circuitry 204B from the third storage 216. In some such examples, the vehicle communication circuitry 214 may provide, deliver, and/or otherwise transmit the performance data, the measurement data, etc., to the ECU 208 (FIGS. 2A-2B) by the vehicle communication bus 206 (FIGS. 2A-2B).

At block 822, the wireless battery management control circuitry 202 determines whether to continue monitoring the battery node(s). For example, the wireless battery control circuitry 212 may determine to continue monitoring and/or controlling one(s) of the battery circuitry 204A-H, and/or, more generally, the wireless battery system 200 (FIGS. 2A-2B). If, at block 822, the wireless battery management control circuitry 202 determines to continue monitoring the battery node(s), control returns to block 804 to generate downlink command(s), otherwise the example machine readable instructions and/or example operations 800 of FIG. 8 conclude.

Figure 9:
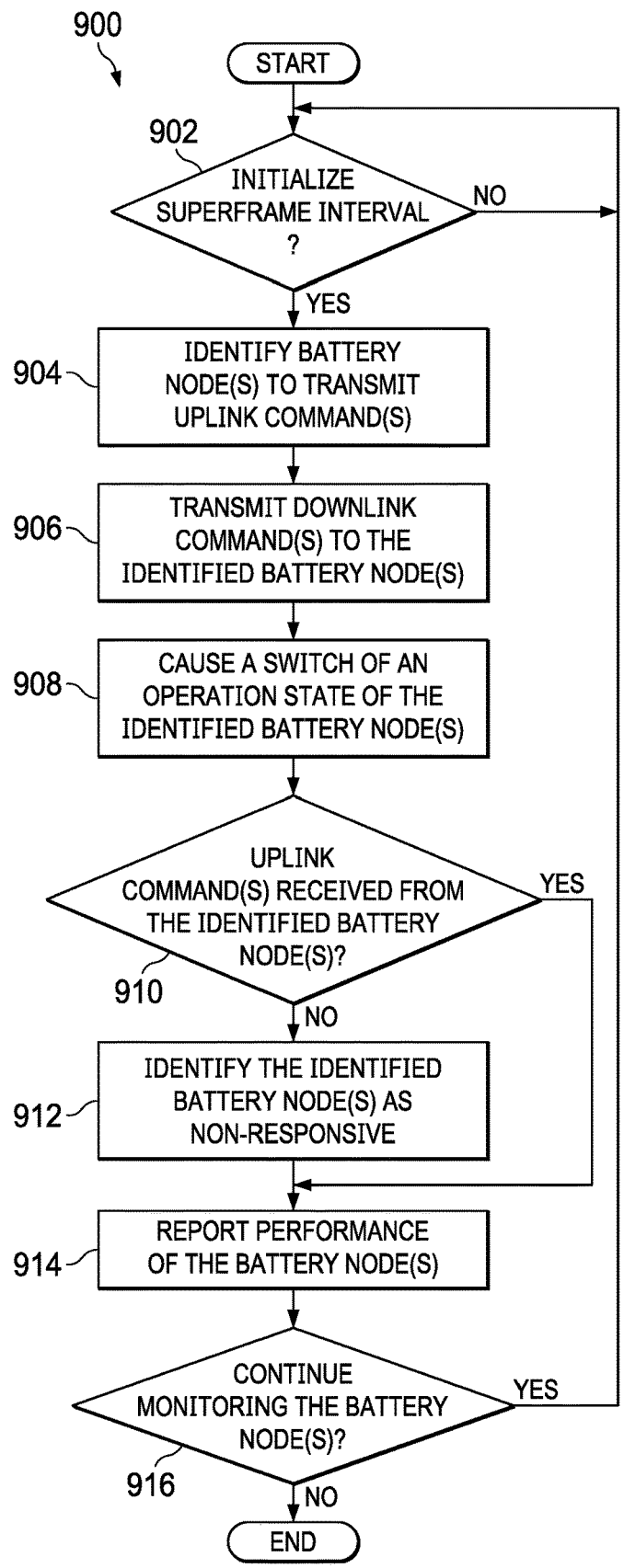
FIG. 9 is a flowchart representative of example machine readable instructions that may be executed to implement the example wireless battery management control circuitry and/or the example battery circuitry of FIGS. 2A-2B for power management of the example wireless battery system of FIGS. 2A-2B based on the example node skipping technique of FIGS. 3-5.

FIG. 9 is a flowchart representative of example machine readable instructions and/or example operations 900 that may be executed and/or instantiated by processor circuitry to execute wireless battery management and/or control based on a node skipping technique. The machine readable instructions and/or operations 900 of FIG. 9 begin at block 902, at which the wireless battery management control circuitry 202 (FIGS. 2A-2B) determines whether to initialize a superframe interval. For example, the wireless battery control circuitry 212 (FIGS. 2A-2B) may determine to initialize, trigger, and/or otherwise begin the first superframe interval 300 of FIG. 3.

At block 904, the wireless battery management control circuitry 202 identifies battery node(s) to transmit uplink command(s). For example, the wireless battery control circuitry 212 may identify the first battery circuitry 204A (FIGS. 2A-2B), which may implement the first battery node 306 of FIGS. 3, 4, 5, 6, and/or 7, and the second battery circuitry 204B (FIGS. 2A-2B), which may implement the second battery node 308 of FIGS. 3, 4, 5, 6, and/or 7, as battery nodes to transmit uplink commands.

At block 906, the wireless battery management control circuitry 202 transmits downlink command(s) to the identified battery node(s). For example, the wireless battery control circuitry 212 may direct the wireless battery communication circuitry 210 (FIGS. 2A-2B) to transmit the first downlink command 316 (FIG. 3) by the transceiver 217 (FIGS. 2A-2B) to the first battery circuitry 204A and the second battery circuitry 204B.

At block 908, the wireless battery management control circuitry 202 causes a switch of an operation state of the identified battery node(s). For example, the wireless battery control circuitry 212 may cause the first battery circuitry 204A and the second battery circuitry 204B to switch from a receive state (e.g., a receive operation state) to a transmit state (e.g., a transmit operation state).

At block 910, the wireless battery management control circuitry 202 determines whether uplink command(s) is/are received from the identified battery node(s). For example, the wireless battery control circuitry 212 may determine whether the first uplink command 322 (FIG. 3) and/or the second uplink command 416 (FIG. 4) are received during an expected time period (e.g., a timeout time period, a timeout timer, etc.).

If, at block 910, the wireless battery management control circuitry 202 determines that the uplink command(s) is/are received from the identified battery node(s), control proceeds to block 914 to report performance of the battery node(s). If, at block 910, the wireless battery management control circuitry 202 determines that the uplink command(s) is/are not received from the identified battery node(s), then, at block 912, the wireless battery control circuitry 212 identifies the identified battery node(s) as non-responsive. For example, the wireless battery control circuitry 212 may determine that the first uplink command 322 has not been received during an expected time period (e.g., a timeout time period, a timeout timer, etc.) and thereby may identify an anomaly, an error, a fault, etc., associated with the first battery circuitry 204A, or portion(s) thereof. In some such examples, the wireless battery control circuitry 212 may identify the first battery 2226A, and/or, more generally, the first battery circuitry 204A, as non-responsive.

At block 914, the wireless battery management control circuitry 202 reports performance of the battery node(s). For example, the vehicle communication circuitry 214 (FIGS. 2A-2B) may retrieve performance data, measurement data, etc., corresponding to the first battery circuitry 204A from the third storage 216 (FIGS. 2A-2B). In some such examples, the vehicle communication circuitry 214 may provide, deliver, and/or otherwise transmit the performance data, the measurement data, etc., to the ECU 208 (FIGS. 2A-2B) by the vehicle communication bus 206 (FIGS. 2A-2B).

At block 916, the wireless battery management control circuitry 202 determines whether to continue monitoring the battery node(s). For example, in response to receiving the first uplink command 322 in the first superframe interval 300 (FIG. 3), the wireless battery control circuitry 212 may determine to trigger the second superframe interval 400 (FIG. 4) to cause the second battery circuitry 204B to transmit the second uplink command 416 to achieve a reduction in power consumption of the wireless battery system 200 (FIGS. 2A-2B). If, at block 916, the wireless battery management control circuitry 202 determines to continue monitoring the battery node(s), control returns to block 902 to determine whether to initialize another superframe interval, otherwise the example machine readable instructions and/or example operations 900 of FIG. 9 conclude.

Figure 10:
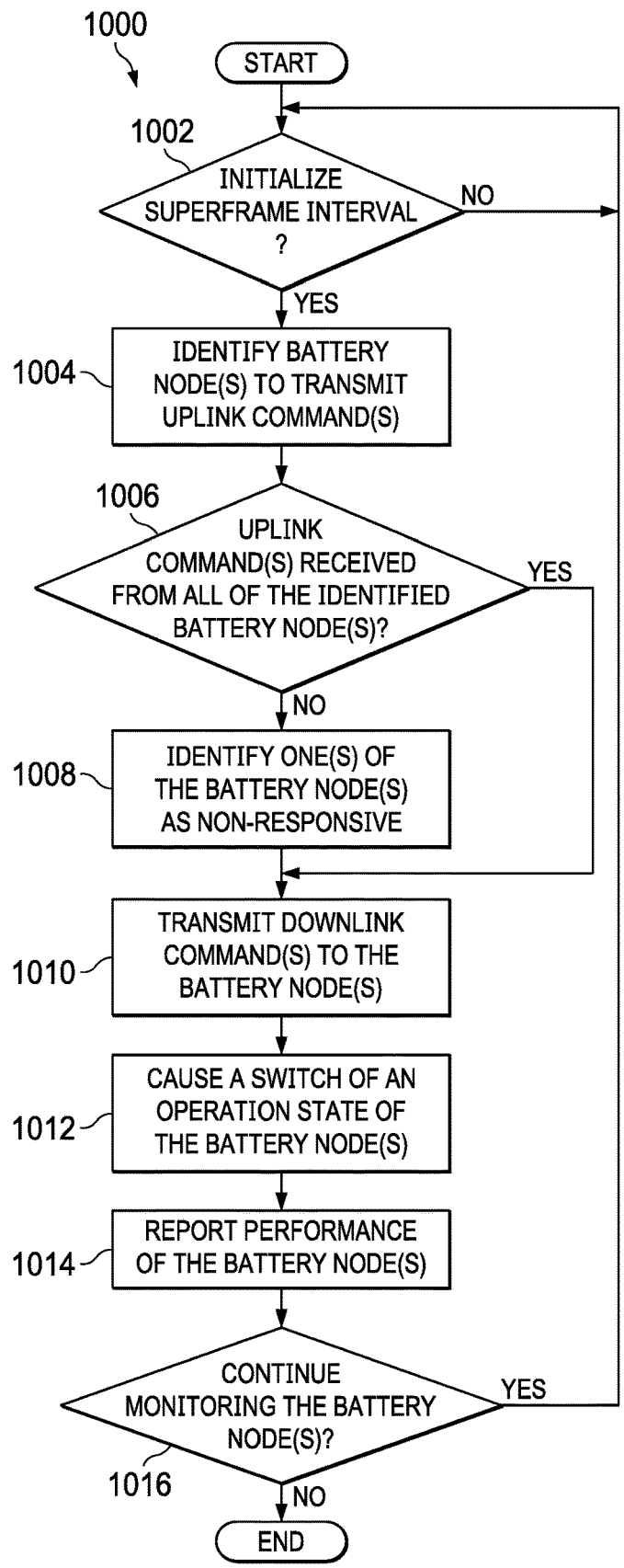
FIG. 10 is a flowchart representative of example machine readable instructions that may be executed to implement the example wireless battery management control circuitry and/or the example battery circuitry of FIGS. 2A-2B for power management of the example wireless battery system of FIGS. 2A-2B based on the example superframe reconstruction technique of FIG. 6.

FIG. 10 is a flowchart representative of example machine readable instructions and/or example operations 1000 that may be executed and/or instantiated by processor circuitry to execute wireless battery management and/or control based on a superframe reconstruction technique. The machine readable instructions and/or operations 1000 of FIG. 10 begin at block 1002, at which the wireless battery management control circuitry 202 determines whether to initialize a superframe interval. For example, the wireless battery control circuitry 212 (FIGS. 2A-2B) may determine to initialize, trigger, and/or otherwise begin the fourth superframe interval 602 of FIG. 6.

At block 1004, the wireless battery management control circuitry 202 identifies battery node(s) to transmit uplink command(s). For example, the wireless battery control circuitry 212 may identify the first battery circuitry 204A (FIGS. 2A-2B), which may implement the first battery node 306 of FIG. 6, the second battery circuitry 204B (FIGS. 2A-2B), which may implement the second battery node 308 of FIG. 6, and the third battery circuitry 204C (FIGS. 2A-2B), which may implement the third battery node 310 of FIG. 6, as battery nodes to transmit uplink commands during the fourth superframe interval 602.

At block 1006, the wireless battery management control circuitry 202 determines whether uplink command(s) is/are received from the identified battery node(s). For example, the wireless battery control circuitry 212 may determine whether the first uplink command 608 (FIG. 6), the second uplink command 614 (FIG. 6), and/or the third uplink command 620 (FIG. 6) is/are received during an expected time period (e.g., a timeout time period, a timeout timer, etc.) of the fourth superframe interval 602.

If, at block 1006, the wireless battery management control circuitry 202 determines that the uplink command(s) is/are received from all of the identified battery node(s), control proceeds to block 1010 to transmit downlink command(s) to the battery node(s). If, at block 1006, the wireless battery management control circuitry 202 determines that the uplink command(s) is/are not received from all of the identified battery node(s), then, at block 1008, the wireless battery management control circuitry 202 identifies one(s) of the battery node(s) as non-responsive. For example, the wireless battery control circuitry 212 may determine that the first uplink command 608 has not been received during an expected time period of the fourth superframe interval 602 and thereby may identify an anomaly, an error, a fault, etc., associated with the first battery circuitry 204A, or portion(s) thereof. In some such examples, the wireless battery control circuitry 212 may identify the first battery 2226A, and/or, more generally, the first battery circuitry 204A, as non-responsive.

At block 1010, the wireless battery management control circuitry 202 transmits downlink command(s) to the battery node(s). For example, the wireless battery control circuitry 212 may direct the wireless battery communication circuitry 210 (FIGS. 2A-2B) to transmit the first downlink command 626 (FIG. 6) by the transceiver 217 (FIGS. 2A-2B) to the first battery circuitry 204A, the second battery circuitry 204B, and the third battery circuitry 204C. In some such examples, the transmission of the first downlink command 626 may constitute an end of the fourth superframe interval 602.

At block 1012, the wireless battery management control circuitry 202 causes a switch of an operation state of the battery node(s). For example, the wireless battery control circuitry 212 may cause the first battery circuitry 204A, the second battery circuitry 204B, and the third battery circuitry 204C to switch from a receive state (e.g., a receive operation state) to a transmit state (e.g., a transmit operation state).

At block 1014, the wireless battery management control circuitry 202 reports performance of the battery node(s). For example, the vehicle communication circuitry 214 (FIGS. 2A-2B) may retrieve performance data, measurement data, etc., corresponding to the first battery circuitry 204A, the second battery circuitry 204B, and/or the third battery circuitry 204C from the third storage 216 FIGS. 2A-2B). In some such examples, the vehicle communication circuitry 214 may provide, deliver, and/or otherwise transmit the performance data, the measurement data, etc., to the ECU 208 (FIGS. 2A-2B) by the vehicle communication bus 206 (FIGS. 2A-2B).

At block 1016, the wireless battery management control circuitry 202 determines whether to continue monitoring the battery node(s). For example, in response to receiving the first uplink command 608, the second uplink command 614, and the third uplink command 620 in the fourth superframe interval 600 (FIG. 6), the wireless battery control circuitry 212 may determine to trigger another superframe interval to follow the conclusion of the fourth superframe interval 602 (FIG. 6). If, at block 1016, the wireless battery management control circuitry 202 determines to continue monitoring the battery node(s), control returns to block 902 to determine whether to initialize another superframe interval, otherwise the example machine readable instructions and/or example operations 1000 of FIG. 10 conclude.

Figure 11:
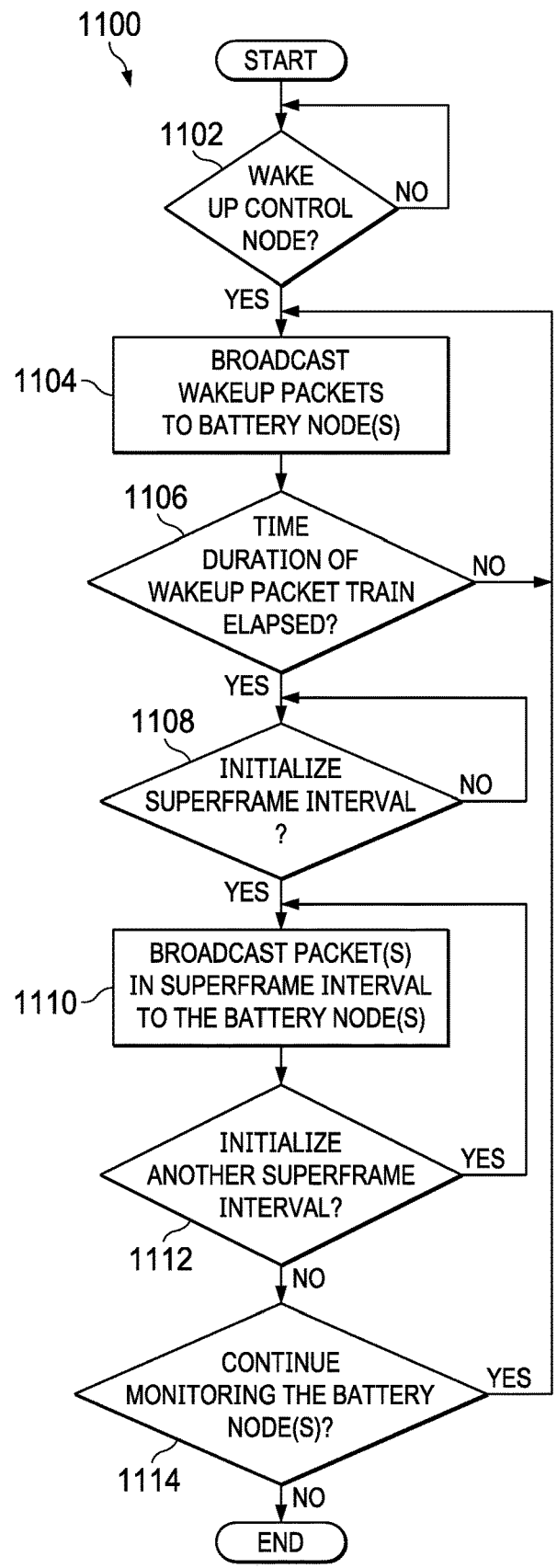
FIG. 11 is a flowchart representative of example machine readable instructions that may be executed to implement the example wireless battery management control circuitry and/or the example battery circuitry of FIGS. 2A-2B for power management of the example wireless battery system of FIGS. 2A-2B based on the example alternating interval type technique of FIG. 7.

FIG. 11 is a flowchart representative of example machine readable instructions and/or example operations 1100 that may be executed and/or instantiated by processor circuitry to execute network formation based on an alternating interval type technique. The machine readable instructions and/or operations 1100 of FIG. 11 begin at block 1102, at which the wireless battery management control circuitry 202 determines whether to wake up a control node. For example, the wireless battery communication circuitry 210 (FIGS. 2A-2B) may determine whether to transition the wireless battery control circuitry 212, and/or, more generally, the wireless battery management control circuitry 202 (FIGS. 2A-2B), from a sleep or standby state to an active or enabled state. In some such examples, the wireless battery control circuitry 212, and/or, more generally, the wireless battery management control circuitry 202 may implement the control node 304 of FIG. 6.

If, at block 1102, the wireless battery management control circuitry 202 determines not to wake up the control node, control waits at block 1102 until the wireless battery management control circuitry 202 determines to wake up the control node. If, at block 1102, the wireless battery management control circuitry 202 determines to wake up the control node, then, at block 1104, the wireless battery management control circuitry 202 broadcasts wakeup packets to battery node(s). For example, the wireless battery control circuitry 212 may broadcast the wakeup train packets 702 (FIG. 7) to the battery circuitry 204A-H during the first time interval 712 (FIG. 7).

At block 1106, the wireless battery management control circuitry 202 determines whether the time duration of the wakeup packet train has elapsed. For example, the wireless battery control circuitry 212 may determine that the first time interval 712 (FIG. 7) has elapsed or not elapsed. If, at block 1106, the wireless battery management control circuitry 202 determines that the time duration of the wakeup packet train has not elapsed, control returns to block 1104 to continue broadcasting wakeup packets to the battery node(s).

If, at block 1106, the wireless battery management control circuitry 202 determines that the time duration of the wakeup packet train has elapsed, control proceeds to block 1108 to determine whether to initialize a superframe interval. For example, the wireless battery control circuitry 212 may determine to initialize and/or otherwise trigger the superframe intervals 720 (FIG. 7) after the wakeup train packets 702.

If, at block 1108, the wireless battery management control circuitry 202 determines not to initialize a superframe interval, control waits at block 1108 until the wireless battery management control circuitry 202 determines to initialize the superframe interval. If, at block 1108, the wireless battery management control circuitry 202 determines to initialize a superframe interval, then, at block 1110, the wireless battery management control circuitry 202 broadcasts packet(s) in a superframe interval to the battery node(s). For example, the wireless battery control circuitry 212 may broadcast one or more packets to the battery circuitry 204A-H during one of the superframe intervals 720 (FIG. 7).

At block 1112, the wireless battery management control circuitry 202 determines whether to initialize another superframe interval. For example, the wireless battery control circuitry 212 may determine to initialize and/or otherwise trigger a second one of the superframe intervals 720 (FIG. 7) after a first one of the superframe intervals 720.

If, at block 1112, the wireless battery management control circuitry 202 determines to initialize another superframe interval, control returns to block 1108 to broadcast packet(s) in the superframe interval to the battery node(s). If, at block 1112, the wireless battery management control circuitry 202 determines not to initialize another superframe interval, then, at block 1114, the wireless battery management control circuitry 202 determines whether to continue monitoring the battery node(s). For example, in response to transmitting the third superframe packet 710 (FIG. 7), the wireless battery control circuitry 212 may determine to trigger another set of wakeup packets in the second wakeup train interval 704 (FIG. 7). If, at block 1114, the wireless battery management control circuitry 202 determines to continue monitoring the battery node(s), control returns to block 1104 to broadcast wakeup packets to the battery node(s), otherwise the example machine readable instructions and/or example operations 1100 of FIG. 11 conclude.

Figure 12:
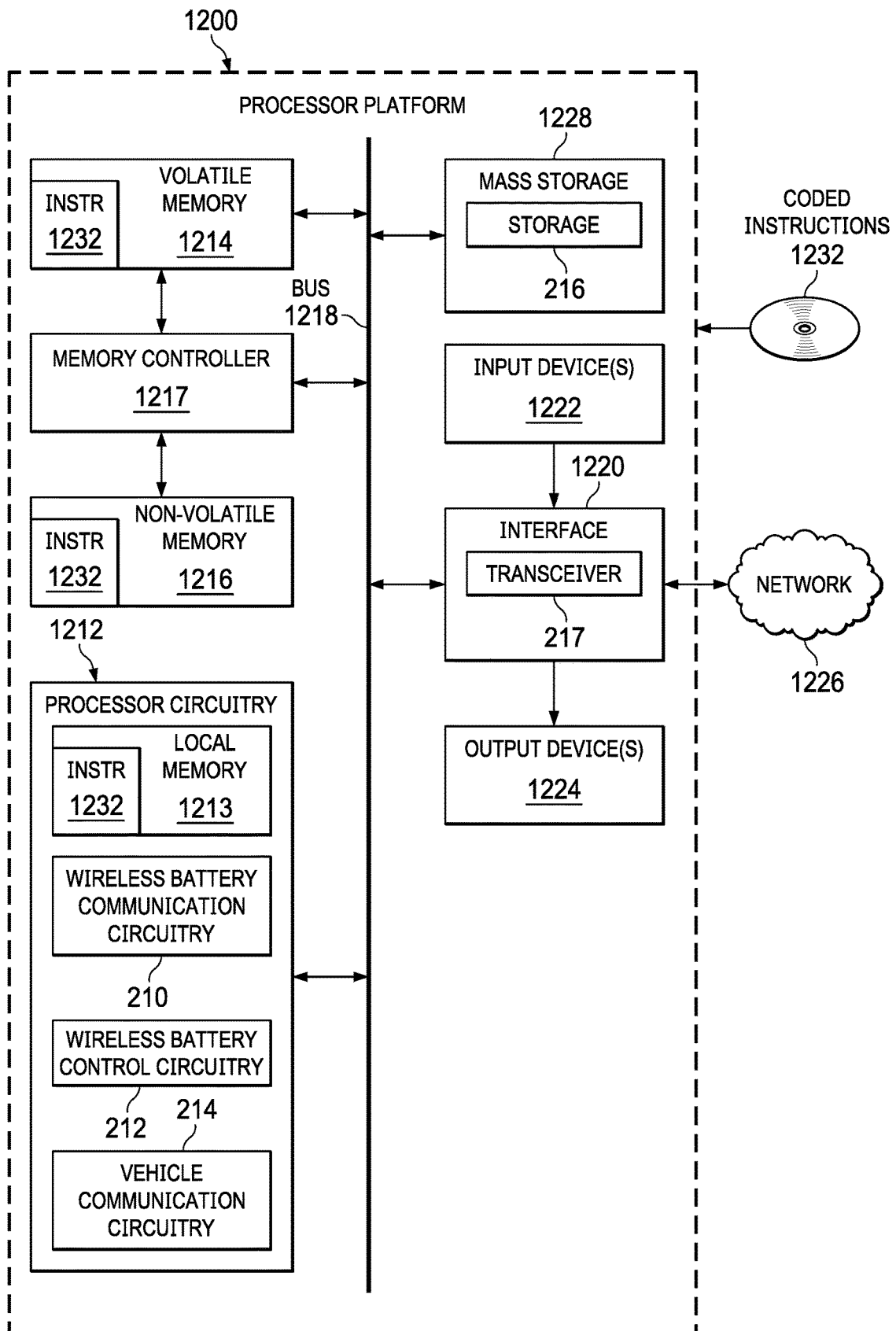
FIG. 12 is a block diagram of an example processing platform including processor circuitry structured to execute the example machine readable instructions of FIGS. 8-11 to implement the example wireless battery management control circuitry of FIGS. 2A-2B.

FIG. 12 is a block diagram of an example processor platform 1200 structured to execute and/or instantiate the machine readable instructions and/or operations of FIGS. 8-11 to implement the wireless battery management control circuitry 202 of FIGS. 2A-2B. The processor platform 1200 can be, for example, a server, a personal computer, a workstation, a self-learning machine (e.g., a neural network), an ECU, or any other type of computing device.

The processor platform 1200 of the illustrated example includes processor circuitry 1212. The processor circuitry 1212 of the illustrated example is hardware. For example, the processor circuitry 1212 can be implemented by one or more integrated circuits, logic circuits, FPGAs microprocessors, CPUs, GPUs, DSPs, and/or microcontrollers from any desired family or manufacturer. The processor circuitry 1212 may be implemented by one or more semiconductor based (e.g., silicon based) devices. In this example, the processor circuitry 1212 implements the example wireless battery communication circuitry 210, the example wireless battery control circuitry 212, and the example vehicle communication circuitry 214 of FIGS. 2A-2B.

The processor circuitry 1212 of the illustrated example includes a local memory 1213 (e.g., a cache, registers, etc.). The processor circuitry 1212 of the illustrated example is in communication with a main memory including a volatile memory 1214 and a non-volatile memory 1216 by a bus 1218. The volatile memory 1214 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1216 may be implemented by flash memory and/or any other desired type of memory device. Access to the main memory 1214, 1216 of the illustrated example is controlled by a memory controller 1217.

The processor platform 1200 of the illustrated example also includes interface circuitry 1220. The interface circuitry 1220 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 1222 are connected to the interface circuitry 1220. The input device(s) 1222 permit(s) a user to enter data and/or commands into the processor circuitry 1212. The input device(s) 1222 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1224 are also connected to the interface circuitry 1220 of the illustrated example. The output devices 1224 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a heads-up display (HUD), a printer, and/or speaker. The interface circuitry 1220 of the illustrated example, thus, typically includes a graphics driver card, a graphics driver chip, and/or graphics processor circuitry such as a GPU.

The interface circuitry 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a line-of-site wireless system, a cellular telephone system, an optical connection, etc. In this example, the interface circuitry 1220 implements the transceiver 217 of FIGS. 2A-2B.

The processor platform 1200 of the illustrated example also includes one or more mass storage devices 1228 to store software and/or data. Examples of such mass storage devices 1228 include magnetic storage devices, optical storage devices, floppy disk drives, HDDs, CDs, Blu-ray disk drives, redundant array of independent disks (RAID) systems, solid state storage devices such as flash memory devices, and DVD drives. In this example, the one or more mass storage devices 1228 implement the third storage 216 of FIGS. 2A-2B.

The machine executable instructions 1232, which may be implemented by the machine readable instructions of FIGS. 8-11, may be stored in the mass storage device 1228, in the volatile memory 1214, in the non-volatile memory 1216, and/or on a removable non-transitory computer readable storage medium such as a CD or DVD.

Figure 13:
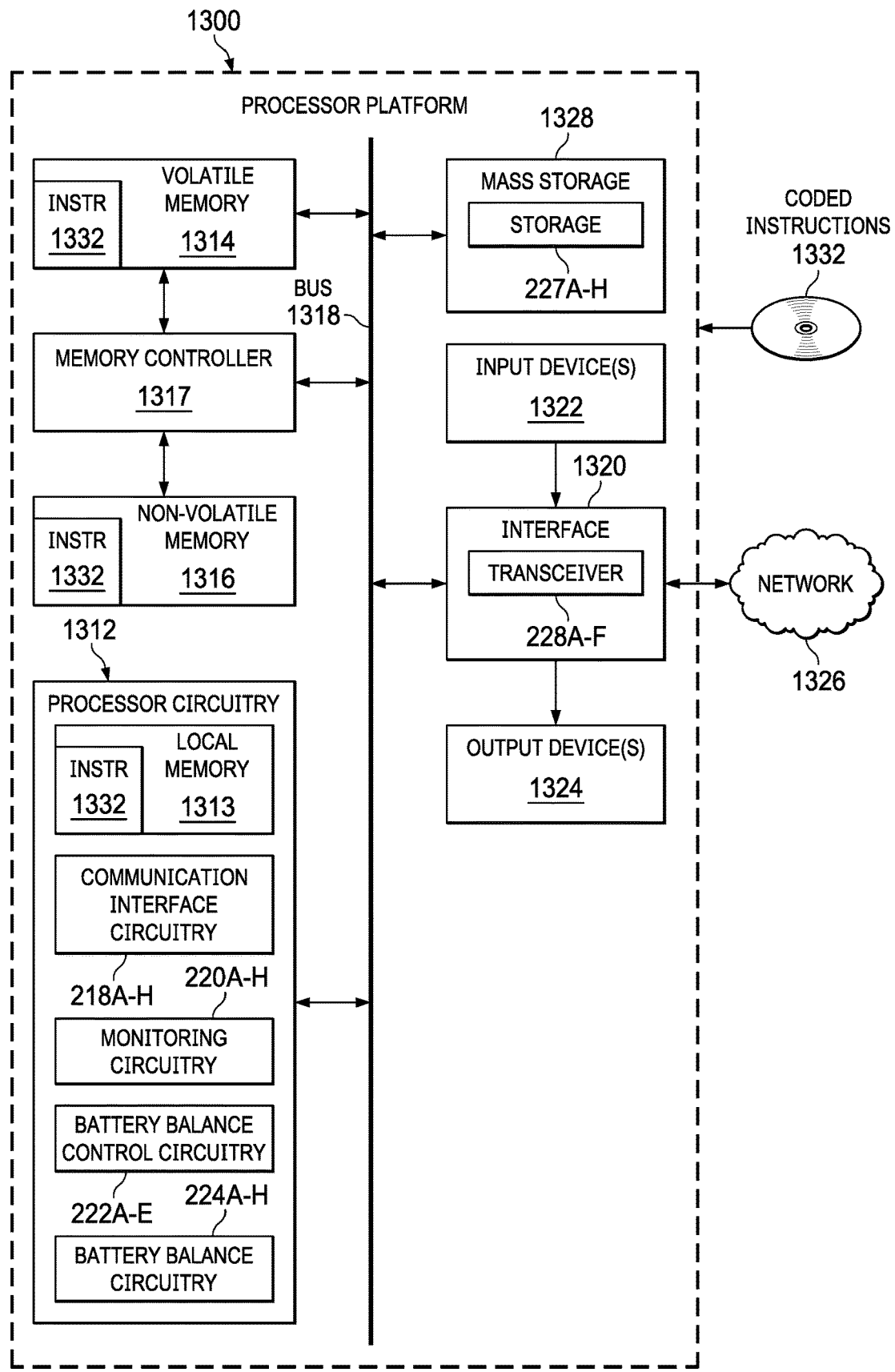
FIG. 13 is a block diagram of an example processing platform including processor circuitry structured to execute the example machine readable instructions of FIGS. 8-11 to implement the example battery circuitry of FIGS. 2A-2B.

FIG. 13 is a block diagram of an example processor platform 1300 structured to execute and/or instantiate the machine readable instructions and/or operations of FIGS. 8-11 to implement the battery circuitry 204A-H of FIGS. 2A-2B. The processor platform 1300 can be, for example, a server, a personal computer, a workstation, a self-learning machine (e.g., a neural network), an ECU, or any other type of computing device.

The processor platform 1300 of the illustrated example includes processor circuitry 1312. The processor circuitry 1312 of the illustrated example is hardware. For example, the processor circuitry 1312 can be implemented by one or more integrated circuits, logic circuits, FPGAs microprocessors, CPUs, GPUs, DSPs, and/or microcontrollers from any desired family or manufacturer. The processor circuitry 1312 may be implemented by one or more semiconductor based (e.g., silicon based) devices. In this example, the processor circuitry 1312 implements the example communication interface circuitry 218A-H, the example monitoring circuitry 220A-H, the example battery balance control circuitry 222A-H, and the example battery balance circuitry 224A-H of FIGS. 2A-2B.

The processor circuitry 1312 of the illustrated example includes a local memory 1313 (e.g., a cache, registers, etc.). The processor circuitry 1312 of the illustrated example is in communication with a main memory including a volatile memory 1314 and a non-volatile memory 1316 by a bus 1318. The volatile memory 1314 may be implemented by SDRAM, DRAM, RDRAM®, and/or any other type of RAM device. The non-volatile memory 1316 may be implemented by flash memory and/or any other desired type of memory device. Access to the main memory 1314, 1316 of the illustrated example is controlled by a memory controller 1317.

The processor platform 1300 of the illustrated example also includes interface circuitry 1320. The interface circuitry 1320 may be implemented by hardware in accordance with any type of interface standard, such as an Ethernet interface, a USB interface, a Bluetooth® interface, an NFC interface, a PCI interface, and/or a PCIe interface.

In the illustrated example, one or more input devices 1322 are connected to the interface circuitry 1320. The input device(s) 1322 permit(s) a user to enter data and/or commands into the processor circuitry 1312. The input device(s) 1322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1324 are also connected to the interface circuitry 1320 of the illustrated example. The output devices 1324 can be implemented, for example, by display devices (e.g., a LED, an OLED, a LCD, a CRT display, an IPS display, a touchscreen, etc.), a tactile output device, an HUD, a printer, and/or speaker. The interface circuitry 1320 of the illustrated example, thus, typically includes a graphics driver card, a graphics driver chip, and/or graphics processor circuitry such as a GPU.

The interface circuitry 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1326. The communication can be by, for example, an Ethernet connection, a DSL connection, a telephone line connection, a coaxial cable system, a satellite system, a line-of-site wireless system, a cellular telephone system, an optical connection, etc. In this example, the interface circuitry 1320 implements the transceiver 228A-F of FIGS. 2A-2B.

The processor platform 1300 of the illustrated example also includes one or more mass storage devices 1328 to store software and/or data. Examples of such mass storage devices 1328 include magnetic storage devices, optical storage devices, floppy disk drives, HDDs, CDs, Blu-ray disk drives, RAID systems, solid state storage devices such as flash memory devices, and DVD drives. In this example, the one or more mass storage devices 1328 implement the fourth storage 227A-H of FIGS. 2A-2B.

The machine executable instructions 1332, which may be implemented by the machine readable instructions of FIGS. 8-11, may be stored in the mass storage device 1328, in the volatile memory 1314, in the non-volatile memory 1316, and/or on a removable non-transitory computer readable storage medium such as a CD or DVD.

Figure 14:
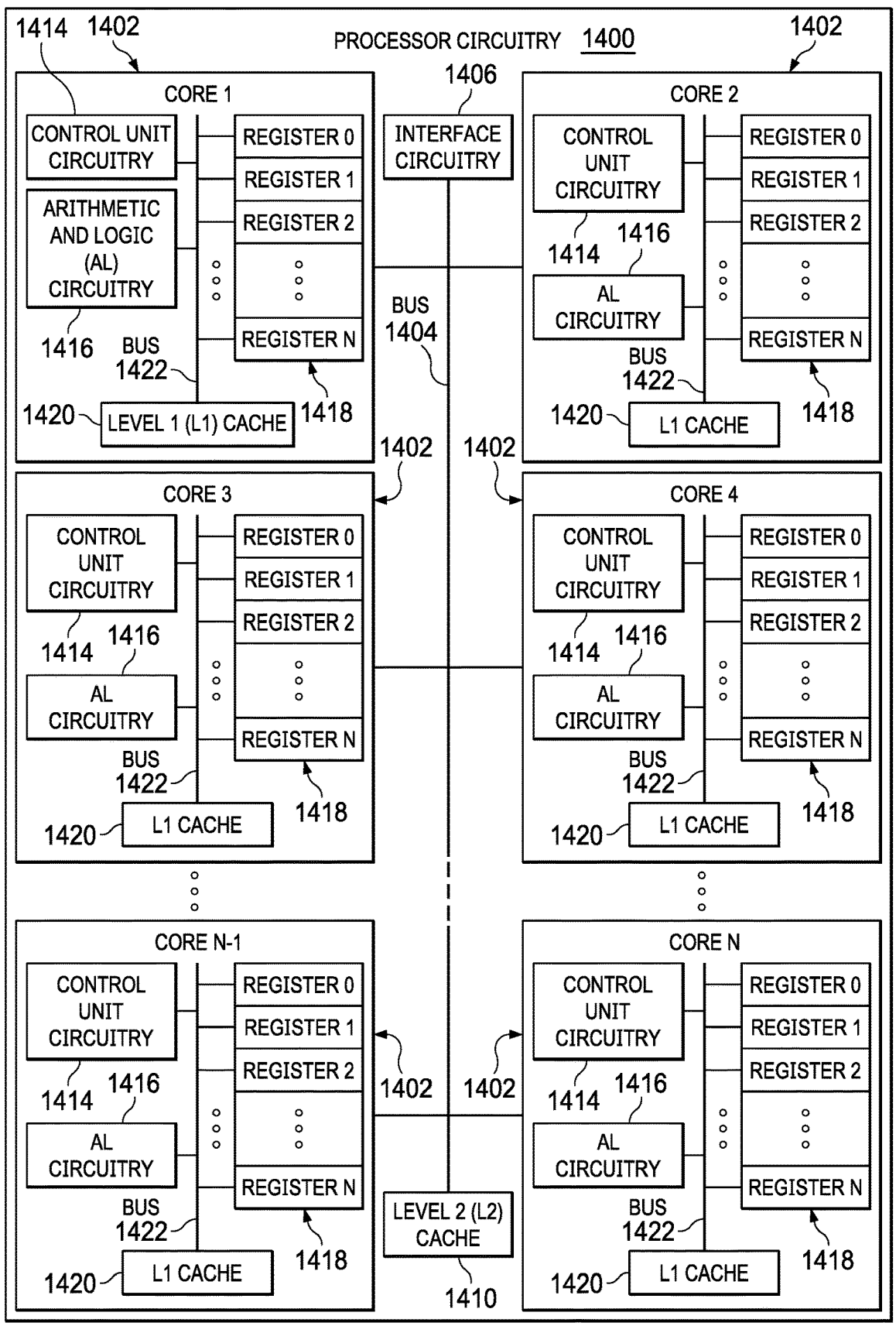
FIG. 14 is a block diagram of an example implementation of the processor circuitry of FIGS. 12 and/or 13.

FIG. 14 is a block diagram of an example implementation of the processor circuitry 1212 of FIG. 12 and/or the processor circuitry 1312 of FIG. 13. In this example, the processor circuitry 1212 of FIG. 12 and/or the processor circuitry 1312 of FIG. 13 is implemented by a microprocessor 1400. For example, the microprocessor 1400 may implement multi-core hardware circuitry such as a CPU, a DSP, a GPU, an XPU, etc. Although it may include any number of example cores 1402 (e.g., 1 core), the microprocessor 1400 of this example is a multi-core semiconductor device including N cores. The cores 1402 of the microprocessor 1400 may operate independently or may cooperate to execute machine readable instructions. For example, machine code corresponding to a firmware program, an embedded software program, or a software program may be executed by one of the cores 1402 or may be executed by multiple ones of the cores 1402 at the same or different times. In some examples, the machine code corresponding to the firmware program, the embedded software program, or the software program is split into threads and executed in parallel by two or more of the cores 1402. The software program may correspond to a portion or all of the machine readable instructions and/or operations represented by the flowcharts of FIGS. 8-11.

The cores 1402 may communicate by a first example bus 1404. In some examples, the first bus 1404 may implement a communication bus to effectuate communication associated with one(s) of the cores 1402. For example, the first bus 1404 may implement at least one of an Inter-Integrated Circuit (I2C) bus, a Serial Peripheral Interface (SPI) bus, a PCI bus, or a PCIe bus. Additionally or alternatively, the first bus 1404 may implement any other type of computing or electrical bus. The cores 1402 may obtain data, instructions, and/or signals from one or more external devices by example interface circuitry 1406. The cores 1402 may output data, instructions, and/or signals to the one or more external devices by the interface circuitry 1406. Although the cores 1402 of this example include example local memory 1420 (e.g., Level 1 (L1) cache that may be split into an L1 data cache and an L1 instruction cache), the microprocessor 1400 also includes example shared memory 1410 that may be shared by the cores (e.g., Level 2 (L2_cache)) for high-speed access to data and/or instructions. Data and/or instructions may be transferred (e.g., shared) by writing to and/or reading from the shared memory 1410. The local memory 1420 of each of the cores 1402 and the shared memory 1410 may be part of a hierarchy of storage devices including multiple levels of cache memory and the main memory (e.g., the main memory 1214, 1216 of FIG. 12 and/or the main memory 1314, 1316 of FIG. 13). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1402 may be referred to as a CPU, DSP, GPU, etc., or any other type of hardware circuitry. Each core 1402 includes control unit circuitry 1414, arithmetic and logic (AL) circuitry (sometimes referred to as an ALU) 1416, a plurality of registers 1418, the L1 cache 1420, and a second example bus 1422. Other structures may be present. For example, each core 1402 may include vector unit circuitry, single instruction multiple data (SIMD) unit circuitry, load/store unit (LSU) circuitry, branch/jump unit circuitry, floating-point unit (FPU) circuitry, etc. The control unit circuitry 1414 includes semiconductor-based circuits structured to control (e.g., coordinate) data movement within the corresponding core 1402. The AL circuitry 1416 includes semiconductor-based circuits structured to perform one or more mathematic and/or logic operations on the data within the corresponding core 1402. The AL circuitry 1416 of some examples performs integer based operations. In other examples, the AL circuitry 1416 also performs floating point operations. In yet other examples, the AL circuitry 1416 may include first AL circuitry that performs integer based operations and second AL circuitry that performs floating point operations. In some examples, the AL circuitry 1416 may be referred to as an Arithmetic Logic Unit (ALU). The registers 1418 are semiconductor-based structures to store data and/or instructions such as results of one or more of the operations performed by the AL circuitry 1416 of the corresponding core 1402. For example, the registers 1418 may include vector register(s), SIMD register(s), general purpose register(s), flag register(s), segment register(s), machine specific register(s), instruction pointer register(s), control register(s), debug register(s), memory management register(s), machine check register(s), etc. The registers 1418 may be arranged in a bank as shown in FIG. 14. Alternatively, the registers 1418 may be organized in any other arrangement, format, or structure including distributed throughout the core 1402 to shorten access time. The second bus 1422 may implement at least one of an I2C bus, a SPI bus, a PCI bus, or a PCIe bus Each core 1402 and/or, more generally, the microprocessor 1400 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1400 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 15:
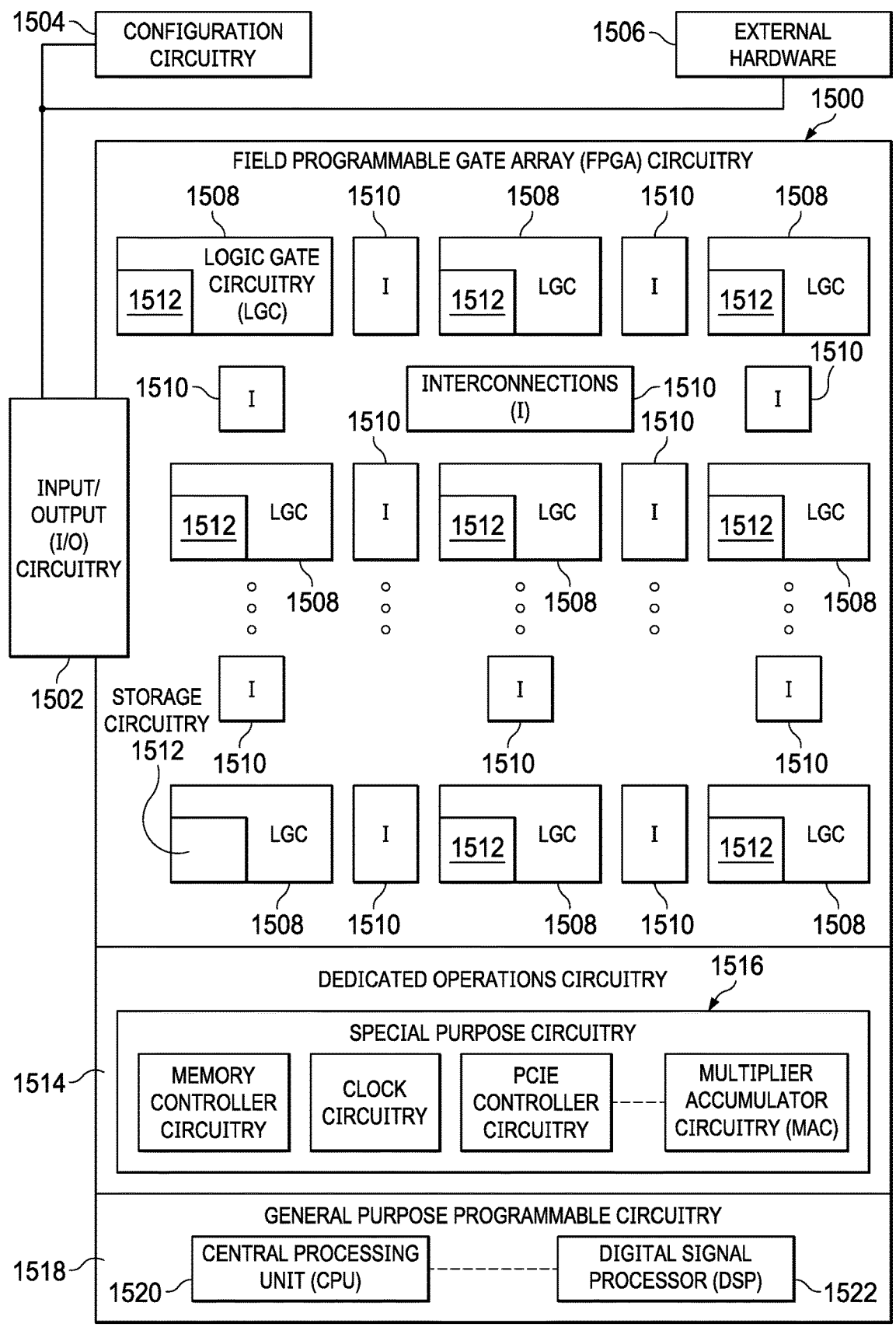
FIG. 15 is a block diagram of another example implementation of the processor circuitry of FIGS. 12 and/or 13.

FIG. 15 is a block diagram of another example implementation of the processor circuitry 1212 of FIG. 12 and/or the processor circuitry 1312 of FIG. 13. In this example, the processor circuitry 1212, 1312 is implemented by FPGA circuitry 1500. The FPGA circuitry 1500 can be used, for example, to perform operations that could otherwise be performed by the example microprocessor 1400 of FIG. 14 executing corresponding machine readable instructions. However, once configured, the FPGA circuitry 1500 instantiates the machine readable instructions in hardware and, thus, can often execute the operations faster than they could be performed by a general purpose microprocessor executing the corresponding software.

More specifically, in contrast to the microprocessor 1400 of FIG. 14 described above (which is a general purpose device that may be programmed to execute some or all of the machine readable instructions represented by the flowcharts of FIGS. 8-11 but whose interconnections and logic circuitry are fixed once fabricated), the FPGA circuitry 1500 of the example of FIG. 15 includes interconnections and logic circuitry that may be configured and/or interconnected in different ways after fabrication to instantiate, for example, some or all of the machine readable instructions represented by the flowcharts of FIGS. 8-11. In particular, the FPGA circuitry 1500 may be thought of as an array of logic gates, interconnections, and switches. The switches can be programmed to change how the logic gates are interconnected by the interconnections, effectively forming one or more dedicated logic circuits (unless and until the FPGA circuitry 1500 is reprogrammed). The configured logic circuits enable the logic gates to cooperate in different ways to perform different operations on data received by input circuitry. Those operations may correspond to some or all of the software represented by the flowcharts of FIGS. 8-11. As such, the FPGA circuitry 1500 may be structured to effectively instantiate some or all of the machine readable instructions of the flowcharts of FIGS. 8-11 as dedicated logic circuits to perform the operations corresponding to those software instructions in a dedicated manner analogous to an ASIC. Therefore, the FPGA circuitry 1500 may perform the operations corresponding to the some or all of the machine readable instructions of FIGS. 8-11 faster than the general purpose microprocessor can execute the same.

In the example of FIG. 15, the FPGA circuitry 1500 is structured to be programmed (and/or reprogrammed one or more times) by an end user by a hardware description language (HDL) such as Verilog. The FPGA circuitry 1500 of FIG. 15, includes example input/output (I/O) circuitry 1502 to obtain and/or output data to/from example configuration circuitry 1504 and/or external hardware (e.g., external hardware circuitry) 1506. For example, the configuration circuitry 1504 may implement interface circuitry that may obtain machine readable instructions to configure the FPGA circuitry 1500, or portion(s) thereof. In some such examples, the configuration circuitry 1504 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1506 may implement the microprocessor 1400 of FIG. 14. The FPGA circuitry 1500 also includes an array of example logic gate circuitry 1508, a plurality of example configurable interconnections 1510, and example storage circuitry 1512. The logic gate circuitry 1508 and interconnections 1510 are configurable to instantiate one or more operations that may correspond to at least some of the machine readable instructions of FIGS. 8-11 and/or other desired operations. The logic gate circuitry 1508 shown in FIG. 15 is fabricated in groups or blocks. Each block includes semiconductor-based electrical structures that may be configured into logic circuits. In some examples, the electrical structures include logic gates (e.g., AND gates, OR gates, NOR gates, etc.) that provide basic building blocks for logic circuits. Electrically controllable switches (e.g., transistors) are present within each of the logic gate circuitry 1508 to enable configuration of the electrical structures and/or the logic gates to form circuits to perform desired operations. The logic gate circuitry 1508 may include other electrical structures such as look-up tables (LUTs), registers (e.g., flip-flops or latches), multiplexers, etc.

The interconnections 1510 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1508 to program desired logic circuits.

The storage circuitry 1512 of the illustrated example is structured to store result(s) of the one or more of the operations performed by corresponding logic gates. The storage circuitry 1512 may be implemented by registers or the like. In the illustrated example, the storage circuitry 1512 is distributed amongst the logic gate circuitry 1508 to facilitate access and increase execution speed.

The example FPGA circuitry 1500 of FIG. 15 also includes example Dedicated Operations Circuitry 1514. In this example, the Dedicated Operations Circuitry 1514 includes special purpose circuitry 1516 that may be invoked to implement commonly used functions to avoid the need to program those functions in the field. Examples of such special purpose circuitry 1516 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1500 may also include example general purpose programmable circuitry 1518 such as an example CPU 1520 and/or an example DSP 1522. Other general purpose programmable circuitry 1518 may additionally or alternatively be present such as a GPU, an XPU, etc., that can be programmed to perform other operations.

Although FIGS. 14 and 15 illustrate two example implementations of the processor circuitry 1212 of FIG. 12 and/or the processor circuitry 1312 of FIG. 13, many other approaches are contemplated. For example, as mentioned above, modern FPGA circuitry may include an on-board CPU, such as one or more of the example CPU 1520 of FIG. 15. Therefore, the processor circuitry 1212 of FIG. 12 and/or the processor circuitry 1312 of FIG. 13 may additionally be implemented by combining the example microprocessor 1400 of FIG. 14 and the example FPGA circuitry 1500 of FIG. 15. In some such hybrid examples, a first portion of the machine readable instructions represented by the flowcharts of FIGS. 8-11 may be executed by one or more of the cores 1402 of FIG. 14 and a second portion of the machine readable instructions represented by the flowcharts of FIGS. 8-11 may be executed by the FPGA circuitry 1500 of FIG. 15.

In some examples, the processor circuitry 1212 of FIG. 12 and/or the processor circuitry 1312 of FIG. 13 may be in one or more packages. For example, the processor circuitry 1400 of FIG. 14 and/or the FPGA circuitry 1500 of FIG. 15 may be in one or more packages. In some examples, an XPU may be implemented by the processor circuitry 1212 of FIG. 12 and/or the processor circuitry 1312 of FIG. 13, which may be in one or more packages. For example, the XPU may include a CPU in one package, a DSP in another package, a GPU in yet another package, and an FPGA in still yet another package.

Figure 16:
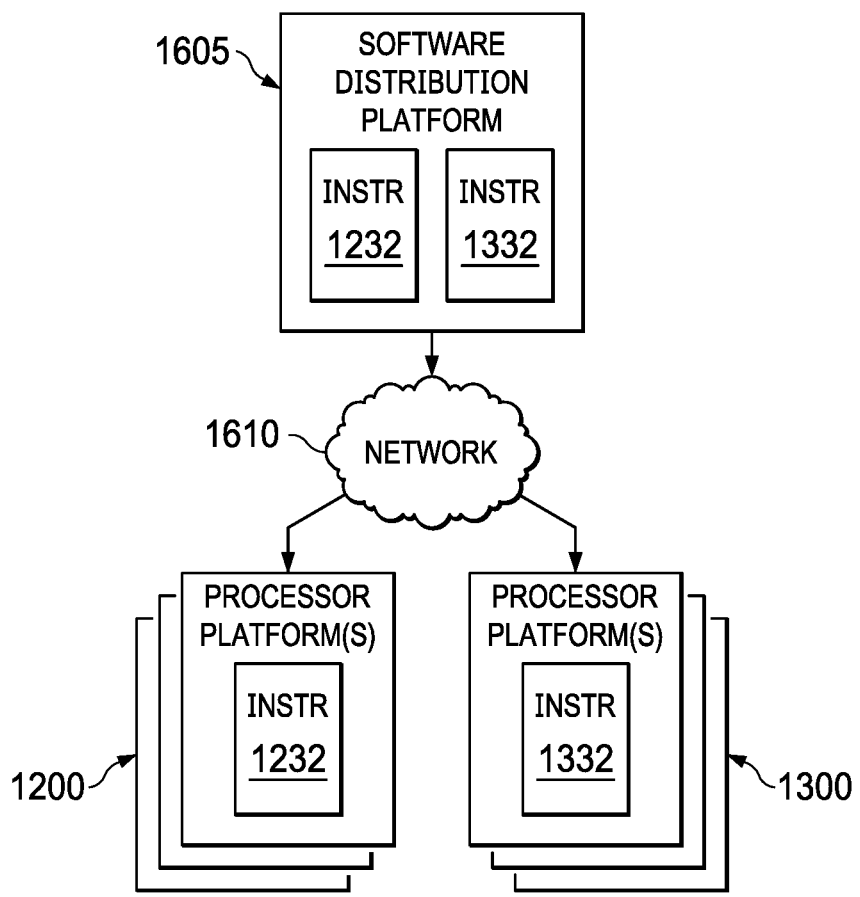
FIG. 16 is a block diagram of an example software distribution platform (e.g., one or more servers) to distribute software (e.g., software corresponding to the example machine readable instructions of FIGS. 8-11) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1605 to distribute software such as the example machine readable instructions 1232 of FIG. 12 and/or the example machine readable instructions 1332 of FIG. 13 to hardware devices owned and/or operated by third parties is illustrated in FIG. 16. The example software distribution platform 1605 may be implemented by any computer server, data facility, cloud service, etc., capable of storing and transmitting software to other computing devices. The third parties may be customers of the entity owning and/or operating the software distribution platform 1605. For example, the entity that owns and/or operates the software distribution platform 1605 may be a developer, a seller, and/or a licensor of software such as the example machine readable instructions 1232 of FIG. 12 and/or the example machine readable instructions 1332 of FIG. 13. The third parties may be consumers, users, retailers, OEMs, etc., who purchase and/or license the software for use and/or re-sale and/or sub-licensing. In the illustrated example, the software distribution platform 1605 includes one or more servers and one or more storage devices. The storage devices store the machine readable instructions 1232 of FIG. 12 and/or the machine readable instructions 1332 of FIG. 13, which may correspond to the example machine readable instructions and/or operations 800, 900, 1000, 1100 of FIGS. 8-11, as described above. The one or more servers of the example software distribution platform 1605 are in communication with a network 1610, which may correspond to any one or more of the Internet and/or any of the example networks 1226, 1326 described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 1232 of FIG. 12 and/or the machine readable instructions 1332 of FIG. 13 from the software distribution platform 1605. For example, the software, which may correspond to the example machine readable instructions and/or operations 800, 900, 1000, 1100 of FIGS. 8-11, may be downloaded to the example processor platform 1200 of FIG. 12, which is to execute the machine readable instructions 1232 of FIG. 12 to implement the wireless battery management control circuitry 202 of FIGS. 2A-2B, and/or the example processor platform 1300 of FIG. 13, which is to execute the machine readable instructions 1332 of FIG. 13 to implement the example battery circuitry 204A-H of FIGS. 2A-2B. In some example, one or more servers of the software distribution platform 1605 periodically offer, transmit, and/or force updates to the software (e.g., the example machine readable instructions 1232 of FIG. 12 and/or the example machine readable instructions 1332 of FIG. 13) to ensure improvements, patches, updates, etc., are distributed and applied to the software at the end user devices.

From the foregoing, it will be appreciated that example systems, methods, apparatus, and articles of manufacture have been disclosed that implement a wireless battery system. The example systems, methods, apparatus, and articles of manufacture may achieve lower power consumption while maintaining same wakeup times of control and/or battery nodes. The example systems, methods, apparatus, and articles of manufacture may achieve improved fault or failure detection by reconstructing superframes in which downlink frames follow uplink frames rather than uplink frames following downlink frames. The example systems, methods, apparatus, and articles of manufacture may achieve lower startup times and/or, more generally, improved network formation by inserting superframes in a fast wakeup sequence. The disclosed systems, methods, apparatus, and articles of manufacture improve the efficiency of using a computing device by implementing at least one of the node skipping technique, the superframe reconstruction technique, or the alternating interval type technique as described herein. The disclosed systems, methods, apparatus, and articles of manufacture are accordingly directed to one or more improvement(s) in the operation of a machine such as a computer or other electronic and/or mechanical device, which may be included in a vehicle such as an EV or HEV.

Example methods, apparatus, systems, and articles of manufacture for a wireless battery system and related method are disclosed herein. Further examples and combinations thereof include the following:

Example 1 includes an apparatus comprising at least one memory, instructions, and processor circuitry to at least one of instantiate or execute the instructions to identify a first battery node to transmit an uplink command during a first superframe interval, transmit a downlink command to the first battery node and a second battery node, the first battery node to switch in the first superframe interval from a receive state to a transmit state in response to the downlink command, the first battery node to transmit the uplink command in the transmit state, and receive the uplink command from the first battery node in the first superframe interval.

Example 2 includes the apparatus of example 1, wherein the processor circuitry is to transmit the downlink command in the first superframe interval, the uplink command is a first uplink command, and the processor circuitry is to cause the second battery node to enter a sleep mode in the first superframe interval after receiving the downlink command, and cause the second battery node in a second superframe interval to switch from the receive state to the transmit state, the second battery node to transmit a second uplink command in the second superframe interval, the second superframe interval after the first superframe interval.

Example 3 includes the apparatus of example 1, wherein the uplink command is a first uplink command, and the processor circuitry is to receive a second uplink command from the second battery node during the first superframe interval, and transmit the downlink command after the receipt of the second uplink command, the receipt of the first uplink command to begin the first superframe interval, the transmission of the downlink command to end the first superframe interval.

Example 4 includes the apparatus of example 3, wherein the processor circuitry is to after the transmission of the downlink command, receive a third uplink command from the first battery node during a second superframe interval, the second superframe interval after the first superframe interval, and after the receipt of the third uplink command, receive a fourth uplink command from the second battery node during the second superframe interval.

Example 5 includes the apparatus of example 1, wherein the first battery node is in an active mode during the first superframe interval and the second battery node is in a standby mode in the first superframe interval after the receipt of the downlink command.

Example 6 includes the apparatus of example 1, wherein the downlink command is a first downlink command in a wakeup train interval, and the processor circuitry is to broadcast second downlink commands at a first frequency to the first battery node and the second battery node in the wakeup train interval, and broadcast third downlink commands at a second frequency to the first battery node and the second battery node in superframe intervals after the wakeup train interval, the first frequency greater than the second frequency.

Example 7 includes the apparatus of example 1, wherein the downlink command includes a request for measurement data associated with the first battery node, the measurement data including at least one of a current, a voltage, or a temperature of the first battery node.

Example 8 includes the apparatus of example 1, wherein the processor circuitry is to generate the downlink command to cause the first battery node to switch from the receive state to the transmit state and to cause the second battery node to enter a sleep mode.

Example 9 includes the apparatus of example 1, wherein the first battery node includes a first battery, the second battery node includes a second battery, and the processor circuitry is to determine a first state of charge of the first battery node based on a first measurement associated with the first battery node, determine a second state of charge of the second battery node based on a second measurement associated with the second battery node, and generate the downlink command to include a first cell balancing command and a second cell balancing command, the first cell balancing command to cause the first battery to be charged based on the first state of charge, the second cell balancing command to cause the second battery to not be charged based on the second state of charge.

Example 10 includes the apparatus of example 9, wherein the processor circuitry is to compare the second measurement to a threshold, and in response to the second measurement satisfying the threshold, detect an anomaly associated with the second battery, the anomaly indicative of the second state of charge being greater than the first state of charge.

Example 11 includes Battery management control circuitry comprising battery control circuitry to identify a first battery node to transmit an uplink command, and battery communication circuitry coupled to the battery control circuitry, the battery communication circuitry to transmit a downlink command to second battery nodes including the first battery node, the first battery node to switch from a receive operation state to a transmit operation state in response to the downlink command, the first battery node to transmit the uplink command in the transmit operation state, and receive the uplink command from the first battery node.

Example 12 includes the battery management control circuitry of example 11, wherein the uplink command is received in a superframe interval to start the superframe interval, the downlink command is transmitted in the superframe interval to end the superframe interval.

Example 13 includes the battery management control circuitry of example 12, wherein the uplink command is a first uplink command, the downlink command is a first downlink command, the superframe interval is a first superframe interval, and the battery communication circuitry is to after the receipt of the first uplink command, receive a second uplink command from a third battery node during the first superframe interval, the second battery nodes including the third battery node, after the receipt of the second uplink command, transmit the first downlink command to the second battery nodes to end the superframe interval, and after the transmission of the first downlink command, receive a third uplink command from the first battery node to begin a second superframe interval after the first superframe interval.

Example 14 includes the battery management control circuitry of example 13, wherein at least one of the battery communication circuitry, the battery control circuitry, or the second battery nodes are in an active mode during the first superframe interval, and at least one of the battery communication circuitry, the battery control circuitry, or the second battery nodes are in a standby mode between the first superframe interval and the second superframe interval.

Example 15 includes the battery management control circuitry of example 11, wherein the downlink command is a first downlink command in a wakeup train interval, and the battery communication circuitry is to broadcast second downlink commands at a first frequency to the second battery nodes in the wakeup train interval, and broadcast third downlink commands at a second frequency to the second battery nodes in superframe intervals, the first frequency greater than the second frequency.

Example 16 includes the battery management control circuitry of example 11, wherein the first battery node includes a first battery, the second battery nodes include a third battery node, the third battery node including a second battery, and the battery control circuitry is to determine a first state of charge of the first battery node based on a first measurement associated with the first battery node, determine a second state of charge of the third battery node based on a second measurement associated with the third battery node, and generate the downlink command to include a first cell balancing command and a second cell balancing command, the first cell balancing command to cause the first battery to be charged based on the first state of charge, the second cell balancing command to cause the second battery to not be charged based on the second state of charge.

Example 17 includes the battery management control circuitry of example 16, further including vehicle communication circuitry coupled to the battery control circuitry, and wherein the battery control circuitry is to compare the second measurement to a threshold, and in response to the second measurement satisfying the threshold, detect an anomaly associated with the second battery, the anomaly indicative of the second state of charge being greater than the first state of charge, and the vehicle communication circuitry is to transmit an alert to an electronic control unit of a vehicle, the alert including the detection of the anomaly.

Example 18 includes Battery circuitry comprising communication interface circuitry to receive a downlink command, and monitoring circuitry coupled to the communication interface circuitry, the monitoring circuitry to switch from a receive state to a transmit state based on the downlink command, the communication interface circuitry to transmit an uplink command in response to the downlink command, the uplink command including a measurement associated with a battery.

Example 19 includes the battery circuitry of example 18, wherein the communication interface circuitry is coupled to an antenna configured to at least one of receive or transmit radiofrequency signals.

Example 20 includes the battery circuitry of example 18, wherein the communication interface circuitry is to receive the downlink command in a first superframe interval and transmit the uplink command during a second superframe interval after the first superframe interval.

Example 21 includes the battery circuitry of example 18, wherein the uplink command is received in a superframe interval and the downlink command is transmitted after the uplink command is received in the superframe interval.

Example 22 includes the battery circuitry of example 21, wherein the superframe interval is a first superframe interval, at least one of the communication interface circuitry or the monitoring circuitry is in an active mode during the superframe interval, and the at least one of the communication interface circuitry or the monitoring circuitry is in a standby mode after the first superframe interval and before a second superframe interval after the first superframe interval.

Example 23 includes the battery circuitry of example 18, further including battery balance circuitry coupled to the battery, the battery balance circuitry to measure at least one of an amperage, a voltage, or a temperature of the battery, and the monitoring circuitry is to obtain the measurement from the battery balance circuitry, determine a state of charge of the battery based on the measurement, and generate the uplink command based on the state of charge of the battery.

Example 24 includes the battery circuitry of example 18, further including battery balance circuitry coupled to the battery and battery balance control circuitry coupled to the battery balance circuitry, the battery balance control circuitry to determine a balancing command based on the downlink command, in response to a determination that the balancing command is indicative of charging the battery, cause the battery to be charged, and in response to a second determination that the balancing command is not indicative of charging the battery, cause the battery to not be charged.

Example 25 includes the battery circuitry of example 18, wherein at least one of the communication interface circuitry, the monitoring circuitry, or the battery are included in an electric vehicle or a hybrid electric vehicle.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   at least one memory;
   instructions; and
   processor circuitry configured to at least one of instantiate or execute the instructions to:
   identify a first battery node to transmit an uplink command during a first superframe interval;
   transmit a downlink command to the first battery node and a second battery node, the first battery node to switch in the first superframe interval from a receive state to a transmit state in response to the downlink command, the first battery node to transmit the uplink command in the transmit state; and
   receive the uplink command from the first battery node in the first superframe interval.

2. The apparatus of claim 1, wherein the processor circuitry is configured to transmit the downlink command in the first superframe interval, the uplink command is a first uplink command, and the processor circuitry is configured to:

cause the second battery node to enter a sleep mode in the first superframe interval after receiving the downlink command; and cause the second battery node in a second superframe interval to switch from the receive state to the transmit state, the second battery node to transmit a second uplink command in the second superframe interval, the second superframe interval after the first superframe interval.

3. The apparatus of claim 1, wherein the uplink command is a first uplink command, and the processor circuitry is configured to:

receive a second uplink command from the second battery node during the first superframe interval; and transmit the downlink command after the receipt of the second uplink command, the receipt of the first uplink command to begin the first superframe interval, the transmission of the downlink command to end the first superframe interval.

4. The apparatus of claim 3, wherein the processor circuitry is configured to:

after the transmission of the downlink command, receive a third uplink command from the first battery node during a second superframe interval, the second superframe interval after the first superframe interval; and after the receipt of the third uplink command, receive a fourth uplink command from the second battery node during the second superframe interval.

5. The apparatus of claim 1, wherein the first battery node is in an active mode during the first superframe interval and the second battery node is in a standby mode in the first superframe interval after the receipt of the downlink command.

6. The apparatus of claim 1, wherein the downlink command is a first downlink command in a wakeup train interval, and the processor circuitry is configured to:

broadcast second downlink commands at a first frequency to the first battery node and the second battery node in the wakeup train interval; and broadcast third downlink commands at a second frequency to the first battery node and the second battery node in superframe intervals after the wakeup train interval, the first frequency greater than the second frequency.

7. The apparatus of claim 1, wherein the downlink command includes a request for measurement data associated with the first battery node, the measurement data including at least one of a current, a voltage, or a temperature of the first battery node.

8. The apparatus of claim 1, wherein the processor circuitry is configured to generate the downlink command to cause the first battery node to switch from the receive state to the transmit state and to cause the second battery node to enter a sleep mode.

9. The apparatus of claim 1, wherein the first battery node includes a first battery, the second battery node includes a second battery, and the processor circuitry is configured to:

determine a first state of charge of the first battery node based on a first measurement associated with the first battery node;

determine a second state of charge of the second battery node based on a second measurement associated with the second battery node; and generate the downlink command to include a first cell balancing command and a second cell balancing command, the first cell balancing command to cause the first battery to be charged based on the first state of charge, the second cell balancing command to cause the second battery to not be charged based on the second state of charge.

10. The apparatus of claim 9, wherein the processor circuitry is configured to:

compare the second measurement to a threshold; and in response to the second measurement satisfying the threshold, detect an anomaly associated with the second battery, the anomaly indicative of the second state of charge being greater than the first state of charge.

11. The apparatus of claim 1, wherein the processor circuitry is configured to:

wake up from a standby mode;

transmit a first train of wakeup packets to the first battery node and the second battery node after waking up from the standby mode;

transmit the downlink command after transmitting the first train of wakeup packets; and transmit a second train of wakeup packets to the first battery node and the second battery node after receiving the uplink command.

12. The apparatus of claim 11, wherein the processor circuitry is configured to:

determine that a time duration of the first train of wakeup packets has elapsed; and transmit the downlink command in response to determining that the time duration of the first train of wakeup packets has elapsed.

13. The apparatus of claim 11, wherein the processor circuitry is configured to:

transmit a second downlink command to the first battery node and the second battery node after receiving the uplink command; and transmit the second train of wakeup packets after transmitting the second downlink command.

14. The apparatus of claim 11, wherein the processor circuitry is configured to interleave a superframe interval including the downlink command and the uplink command between the first and second trains of wakeup packets.

15. Battery management control circuitry comprising:

battery control circuitry to identify a first battery node to transmit an uplink command; and battery communication circuitry coupled to the battery control circuitry, the battery communication circuitry configured to:

transmit a downlink command to a set of battery nodes including the first battery node, the first battery node to switch from a receive operation state to a transmit operation state in response to the downlink command, the first battery node to transmit the uplink command in the transmit operation state; and receive the uplink command from the first battery node.

16. The battery management control circuitry of claim 15, wherein the uplink command is received in a superframe interval to start the superframe interval, the downlink command is transmitted in the superframe interval to end the superframe interval.

17. The battery management control circuitry of claim 16, wherein the uplink command is a first uplink command, the downlink command is a first downlink command, the superframe interval is a first superframe interval, and the battery communication circuitry is configured to:

after the receipt of the first uplink command, receive a second uplink command from a third battery node during the first superframe interval, the set of battery nodes including the third battery node;

after the receipt of the second uplink command, transmit the first downlink command to the set of battery nodes to end the superframe interval; and after the transmission of the first downlink command, receive a third uplink command from the first battery node to begin a second superframe interval after the first superframe interval.

18. The battery management control circuitry of claim 17, wherein at least one of the battery communication circuitry, the battery control circuitry, or the set of battery nodes are in an active mode during the first superframe interval, and at least one of the battery communication circuitry, the battery control circuitry, or the set of battery nodes are in a standby mode between the first superframe interval and the second superframe interval.

19. The battery management control circuitry of claim 15, wherein the downlink command is a first downlink command in a wakeup train interval, and the battery communication circuitry is configured to:

broadcast second downlink commands at a first frequency to the set of battery nodes in the wakeup train interval; and broadcast third downlink commands at a second frequency to the set of battery nodes in superframe intervals, the first frequency greater than the second frequency.

20. The battery management control circuitry of claim 15, wherein the first battery node includes a first battery, the set of battery nodes include a third battery node, the third battery node including a second battery, and the battery control circuitry is configured to:

determine a first state of charge of the first battery node based on a first measurement associated with the first battery node;

determine a second state of charge of the third battery node based on a second measurement associated with the third battery node; and generate the downlink command to include a first cell balancing command and a second cell balancing command, the first cell balancing command to cause the first battery to be charged based on the first state of charge, the second cell balancing command to cause the second battery to not be charged based on the second state of charge.

21. The battery management control circuitry of claim 20, further including vehicle communication circuitry coupled to the battery control circuitry, and wherein:

the battery control circuitry is configured to:
compare the second measurement to a threshold; and
in response to the second measurement satisfying the threshold, detect an anomaly associated with the second battery, the anomaly indicative of the second state of charge being greater than the first state of charge; and the vehicle communication circuitry is to transmit an alert to an electronic control unit of a vehicle, the alert including the detection of the anomaly.

22. The battery management control circuitry of claim 15, wherein the battery control circuitry is configured to wake up from a standby mode, and wherein the battery communication circuitry is configured to:

transmit a first train of wakeup packets to the set of battery nodes after the battery control circuitry wakes up from the standby mode;

transmit the downlink command after transmitting the first train of wakeup packets; and transmit a second train of wakeup packets to the set of battery nodes after receiving the uplink command.

23. The battery management control circuitry of claim 22, wherein the battery control circuitry is configured to:

determine that a time duration of the first train of wakeup packets has elapsed; and cause the battery communication circuitry to transmit the downlink command in response to determining that the time duration of the first train of wakeup packets has elapsed.

24. The battery management control circuitry of claim 22, wherein the battery communication circuitry is configured to:

transmit a second downlink command to the set of battery nodes after receiving the uplink command; and transmit the second train of wakeup packets after transmitting the second downlink command.

25. A method comprising:

identifying a first battery node to transmit an uplink command during a first superframe interval;

transmitting a downlink command to the first battery node and a second battery node, the first battery node to switch in the first superframe interval from a receive state to a transmit state in response to the downlink command, the first battery node to transmit the uplink command in the transmit state; and receiving the uplink command from the first battery node in the first superframe interval.

* * * * *